United States Patent
Takahashi et al.

[11] Patent Number: 6,150,823
[45] Date of Patent: Nov. 21, 2000

[54] BATTERY CHARGE DETECTING VARIABLE LOADS

[75] Inventors: Koji Takahashi; Isao Harigaya; Hiroyuki Takimoto, all of Kanagawa-ken; Kazumitsu Tobe, Chiba-ken; Takayuki Saeki, Kanagawa-ken, all of Japan

[73] Assignee: Canon Kabushiki Kaisha, Tokyo, Japan

[21] Appl. No.: 07/968,250

[22] Filed: Oct. 29, 1992

Related U.S. Application Data

[63] Continuation of application No. 07/625,863, Dec. 11, 1990, abandoned.

[30] Foreign Application Priority Data

| Dec. 11, 1989 | [JP] | Japan | 1-320834 |
|---|---|---|---|
| Dec. 11, 1989 | [JP] | Japan | 1-320835 |
| Dec. 11, 1989 | [JP] | Japan | 1-320836 |
| Dec. 11, 1989 | [JP] | Japan | 1-320837 |
| Dec. 11, 1989 | [JP] | Japan | 1-320842 |
| Dec. 11, 1989 | [JP] | Japan | 1-320843 |
| Dec. 11, 1989 | [JP] | Japan | 1-320844 |

[51] Int. Cl.[7] .......................... G01N 27/416; G01R 31/36
[52] U.S. Cl. ........................ 324/427; 324/429; 324/431; 340/636
[58] Field of Search .................... 324/426, 427, 324/429, 431; 340/636; 320/106, 135

[56] References Cited

U.S. PATENT DOCUMENTS

| 3,876,931 | 4/1975 | Godshalk | 324/429 |
|---|---|---|---|
| 3,946,299 | 3/1976 | Christianson et al. | 320/48 X |
| 4,380,726 | 4/1983 | Sado et al. | 320/48 |
| 4,460,870 | 7/1984 | Finger | 324/431 X |
| 4,949,046 | 8/1990 | Seyfang | 324/431 X |
| 5,105,180 | 4/1992 | Yamada et al. | 340/636 |
| 5,111,148 | 5/1992 | Senoo et al. | 324/433 |
| 5,434,495 | 7/1995 | Toko | 320/48 |
| 5,451,881 | 9/1995 | Finger | 324/427 |
| 5,493,199 | 2/1996 | Koenck et al. | 320/106 |
| 5,608,324 | 3/1997 | Yoshida | 324/426 |
| 5,608,385 | 3/1997 | Masaki | 340/636 |

Primary Examiner—Glenn W. Brown
Attorney, Agent, or Firm—Robin, Blecker & Daley

[57] ABSTRACT

Device for detecting the charge condition of a battery which measures the first output of the battery when connected to the first load and the second output of the battery when connected to the second load, and performs a predetermined computation on the basis of both the first and second outputs of the battery to detect the charge condition of the battery. The charge condition of the battery can be very accurately detected.

21 Claims, 26 Drawing Sheets

| OPERATING MODE | STOP MODE | RECORDING-PAUSE MODE | RECORDING MODE |
|---|---|---|---|
| MEASUREMENT POINT | | V1 ↑ ↑ V2 | V1 ↑ ↑ V2 |
| MEASUREMENT OF OPEN-CIRCUIT VOLTAGE v | | ↑<br>V1 | ↑<br>V2 |

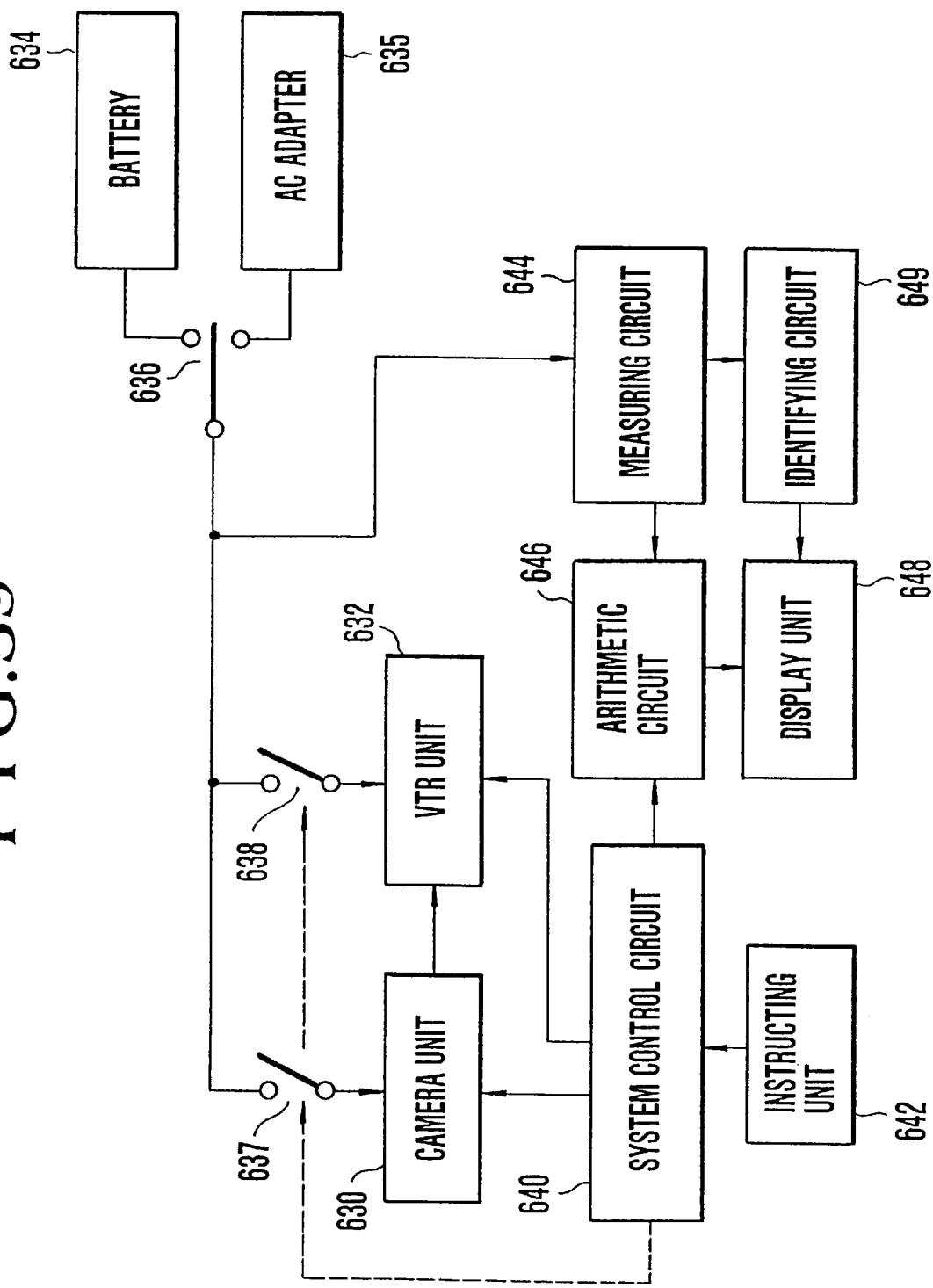

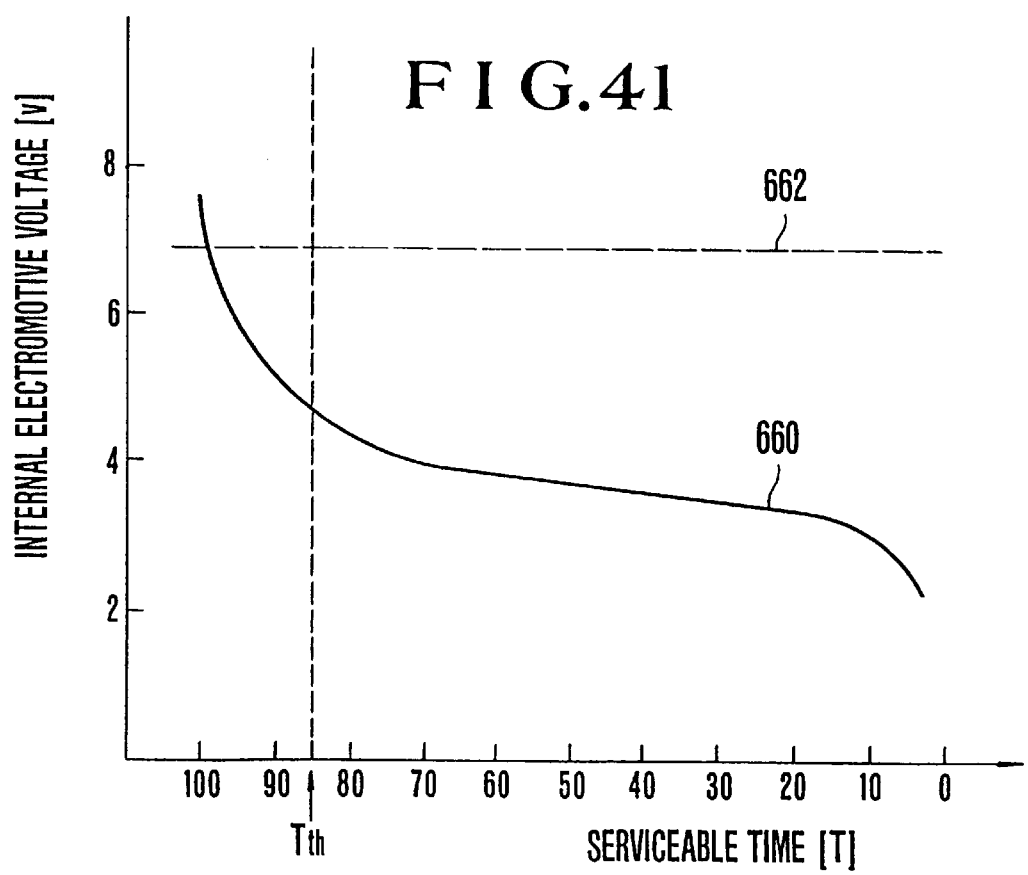

BATTERY CHARGE DETECTING VARIABLE LOADS

This is a continuation application under 37 CFR 1.62 of prior application Ser. No. 625,683, filed Dec. 11, 1990, now abandoned.

BACKGROUND OF THE INVENTION

1. Field of the Invention

The present invention relates to a remaining-amount-of-battery detecting device for detecting the remaining amount of battery power.

2. Description of the Related Art

Apparatus of the type using batteries as power sources have conventionally utilized various methods for detecting the remaining amount of battery power. Typical examples are a method of monitoring the discharge voltage of a battery and a method of estimating the remaining amount of battery power by integrating the discharge time of a battery which is fully charged and cumulatively calculating the amount of consumed power. In the case of a charger, a method of monitoring variations of charging voltage is proposed.

However, any of the above-described conventional methods has a number of disadvantages. For example, although each of the methods utilizes the terminal voltage of a battery to detect the remaining amount of battery power, the terminal voltages of individual batteries exhibit large variations, with the result that it is extremely difficult to quantitatively detect the extent of charge or discharge of a battery to be measured, i.e., the remaining amount of battery power or the amount of battery power used, on the basis of the terminal voltage of the battery. It is also extremely difficult to quantitatively display the detected result as the amount of time. For this reason, in any of the conventional methods, the presence or absence of the remaining amount of battery power can only be detected. Additional disadvantage of the conventional method is that, in a case where a battery is charged through a charger, it is impossible to quantitatively detect to what extent the battery has been charged. As a result, it is only possible to know whether the battery is fully charged.

In addition, the method of detecting the remaining amount of battery power by integrating the discharge time and/or discharge current of a battery has limitations in that it is necessary to prepare a battery which is fully charged at the beginning of service and starts integrating the discharge time of the battery in the state of full charge. As a result, this method cannot be applied to an insufficiently charged battery. Also, none of the above-described methods can be adapted to unexpected variations in the service conditions of a battery, and a value detected in such a case is unreliable.

During the operation of a portable apparatus using a battery as a power source, particularly an apparatus whose power consumption is large compared to the capacity of a battery incorporated therein, for example, a portable video camera, since the consumption of the battery rapidly proceeds, an operator will be very anxious to know the remaining serviceable time of the apparatus.

As is known, a conventional portable video camera is provided with a remaining-amount-of-battery display for displaying the remaining amount of battery power. The conventional remaining-amount-of-battery display is arranged to measure the output voltage of a battery and give a warning when the measured value falls below a predetermined value.

However, since this method does not allow for the discharge characteristic or internal resistance of a battery, the display accuracy of the remaining amount of battery power has been insufficient. For example, if the output voltages of batteries in a loaded state are the same but their kinds are different from each other, they will exhibit different discharge characteristics. This leads to the problem that a displayed remaining-amount value does not indicate the accurate remaining amount of battery power.

As a remaining-amount-of-battery display of this kind, a certain device is known. This device is arranged to integrate the amount of consumed power corresponding to the state of service of a battery with respect to service time and to subtract the integral from the amount of battery power obtainable in a fully charged state, thereby estimating the remaining amount of battery power.

FIG. 1 shows an example of an arrangement in which the remaining-amount-of-battery display is applied to a camera-integrated video tape recorder (or camcorder). The camcorder shown in FIG. 1 comprises a camera unit 1, a VTR unit 2, a battery 4 for supplying electrical power to the camera unit 1 and the VTR unit 2, a system control circuit 5 for controlling the operations of the camera unit 1 and the VTR unit 2, an instructing unit 6 operated to input an instruction indicative of a predetermined operation into the system control circuit 5, a display unit 7 for displaying the state of operation of the system control circuit 5, and a counter 8 for integrating the electrical power consumed by the system. Reference numeral 9 denotes a TV unit for displaying image signals outputted from the camera unit 1 or the VTR unit 2.

When the camcorder shown in FIG. 1 is being used in, for example, a photographing and recording mode, the camera unit 1 and the VTR unit 2 are in operation and the current consumed by the system is 2.4 amperes. In a reproducing mode, if the camera unit 1 is not in operation and only the VTR unit 2 is in operation, the current consumed by the system is 1.8 amperes.

If an operator inputs an instruction indicative of execution of the photographing and recording mode from the instructing unit 6, electrical power is supplied from the battery 4 to the camera unit 1 and/or the VTR unit 2 and each element initiates an operation corresponding to the operating mode specified from the instructing unit 6. During this time, the counter 8 is cumulatively incrementing a count per unit time corresponding to each operating mode.

More specifically, a count factor corresponding to the power consumption required in each operating mode is set in advance, and the system control circuit 5 controls the counting operation of the counter 8 in accordance with each operating mode. In the above-described example, since the consumed currents are 2.4 and 1.8 amperes in the photographing and recording mode and the recording mode, respectively, the corresponding count factors are set to "4" and "3". In the photographing and recording mode, the counter 8 counts up by four per second and, in the reproducing mode, by three per second.

Each time the operation of a main operating unit 3 consisting of the camera unit 1 and the VTR unit 2 is stopped or interrupted, the system control circuit 5 fetches the count of the counter 8, obtains the consumed power of the battery 4 through arithmetic operations, and causes the display unit 7 to display the remaining amount of battery power of the battery 4. When the battery 4 is replaced, the counter 8 is reset.

In the above-described arrangement, the thus-obtained remaining amount of battery power is divided by the value of the current consumed in the photographing and recording mode, whereby the remaining recording time during which photography is possible can be displayed.

However, the arrangement shown in FIG. 1 has a number of disadvantages. For example, if errors in power consumption occur when the state of operation of the system is switched or due to a difference in fine mode setting, it will be impossible to detect the remaining amount of battery power with high accuracy. It is also impossible to estimate the remaining amount of battery power of a battery which has been halfway consumed. In addition, in a case where an AC power source is used, i.e., in the case of a system which can be used with a so-called AC adapter for transforming AC power into DC power, the arrangement of FIG. 1 operates to integrate the amount of power consumed when the AC adapter is in operation. As a result, the remaining amount of battery power will be inappropriately calculated and displayed.

SUMMARY OF THE INVENTION

It is, therefore, an object of the present invention to provide a remaining-amount-of-battery detecting device which can solve the above-described problems.

Another object of the present invention is to provide a remaining-amount-of-battery detecting device which can accurately detect the remaining amount of battery power.

To achieve the above objects, according to one aspect of the present invention, there is provided a remaining-amount-of-battery detecting device for detecting the remaining amount of battery power, which is provided with measuring means for measuring the open-circuit voltage of a battery, and detecting means for detecting the remaining amount of battery power on the basis of the open-circuit voltage of the battery measured by the measuring means.

Another object of the present invention is to provide a remaining-amount-of-battery detecting device which can accurately detect the remaining amount of battery power without being influenced by temperature variations.

To achieve the above object, according to another aspect of the present invention, there is provided a remaining-amount-of-battery detecting device for detecting the remaining amount of battery power, which is provided with temperature compensating means for effecting temperature compensation of a plurality of outputs, each of which output is provided by a battery when one of a respective different kinds of loads is connected to the battery; open-circuit-voltage detecting means for detecting an open-circuit voltage on the basis of the plurality of outputs of the battery which are temperature-compensated by the temperature compensating means; and remaining-amount-of-battery detecting means for detecting the remaining amount of battery power by comparing the open-circuit voltage detected by the open-circuit-voltage detecting means with data indicative of the relation between the open-circuit voltage of the battery and the remaining amount of battery power.

Another object of the present invention is to provide a remaining-amount-of-battery detecting device which can accurately and automatically detect the remaining amount of battery power without performing any special operation.

To achieve the above object, according to another aspect of the present invention, there is provided a remaining-amount-of-battery detecting device for detecting the remaining amount of battery power, which is provided with open-circuit-voltage calculating means, including a plurality of kinds of operating states having different load resistances, for calculating the open-circuit voltage of a battery from the outputs of the battery which are detected after and before a change from one operating mode to another, and remaining-amount-of-battery detecting means for finding the remaining amount of battery power by comparing the open-circuit voltage calculated by the open-circuit-voltage calculating means with data indicative of the relation between the open-circuit voltage of the battery and the remaining amount of battery power thereof.

Another object of the present invention is to provide a remaining-amount-of-battery detecting device which can detect the accurate remaining amount of battery power irrespective of the kind of battery.

To achieve the above object, according to another aspect of the present invention, there is provided a remaining-amount-of-battery detecting device for detecting the remaining amount of battery power, which is provided with measuring means for measuring the output of a battery, memory means for storing data relative to the discharge characteristics of a plurality of kinds of batteries, and detecting means for identifying the kind of battery in use on the basis of a measurement result provided by the measuring means and the data stored in the memory means, and detecting the remaining amount of battery power on the basis of data corresponding to the battery in use from among the data stored in the memory means.

Another object of the present invention is to provide a remaining-amount-of-battery detecting device which can detect the accurate remaining amount of battery power even if the system is continuously used in a particular operating mode.

To achieve the above object, according to another aspect of the present invention, there is provided a remaining-amount-of-battery detecting device for detecting the remaining amount of battery power, which is provided with remaining-amount detecting means including a plurality of kinds of operating modes for detecting the remaining amount of battery power on the basis of a variation of the output of the battery with a change from one operating mode to another, consumed-amount detecting means for detecting the consumed amount of battery power of the battery if the same operating mode continues for a predetermined time, and correcting means for correcting the remaining amount of battery power detected by the remaining-amount detecting means by using the consumed amount of battery power detected by the consumed-amount detecting means.

Yet another object of the present invention is to provide a remaining-amount-of-battery detecting device which can determine whether a power source used is a battery by means of a simple arrangement so that an erroneous display of the remaining amount of battery power can be prevented.

To achieve the above object, according to another aspect of the present invention, there is provided a remaining-amount-of-battery detecting device for detecting the remaining amount of battery power, which is provided with remaining-amount detecting means for detecting the remaining amount of battery power by comparing the previously memorized characteristic of the remaining amount of battery power with the measured value of battery power, and with identifying means for determining whether a power source is a battery on the basis of the remaining amount of electrical power in the power source in use, detected by the remaining-amount detecting means, to inhibit the detecting operation of the remaining-amount detecting means if the power source is not a battery.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 39 is a block diagram showing an arrangement in which a ninth embodiment of the present invention is applied to a video camera;

FIG. 41 is a graphic representation showing a characteristic curve obtained when a Ni-Cd secondary battery is used.

DETAILED DESCRIPTION OF THE PREFERRED EMBODIMENTS

Preferred embodiments of the present invention will be described below with reference to the accompanying drawings.

A first embodiment of the present invention will be described below with reference to FIGS. 2 to 5.

Figure 1:
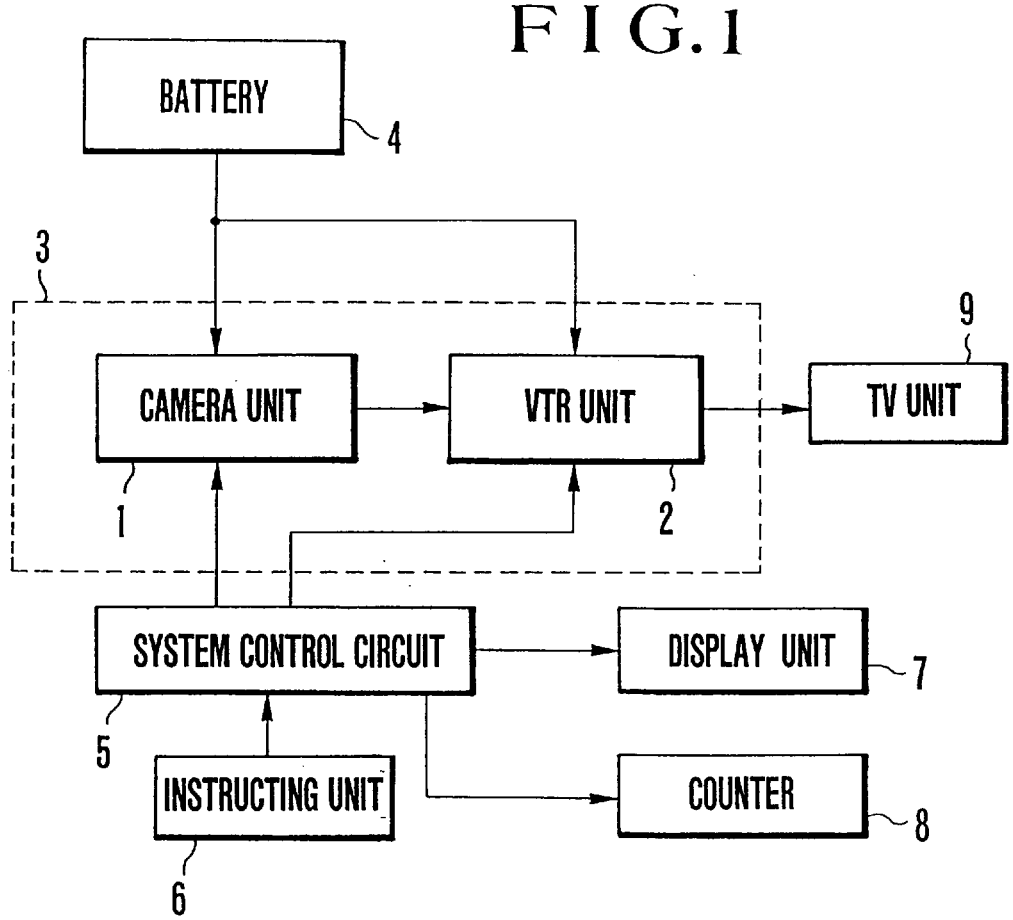
FIG. 1 is a block diagram showing an example of an arrangement in which a remaining-amount-of-battery display is applied to a camera-integrated video tape recorder.
Figure 2:
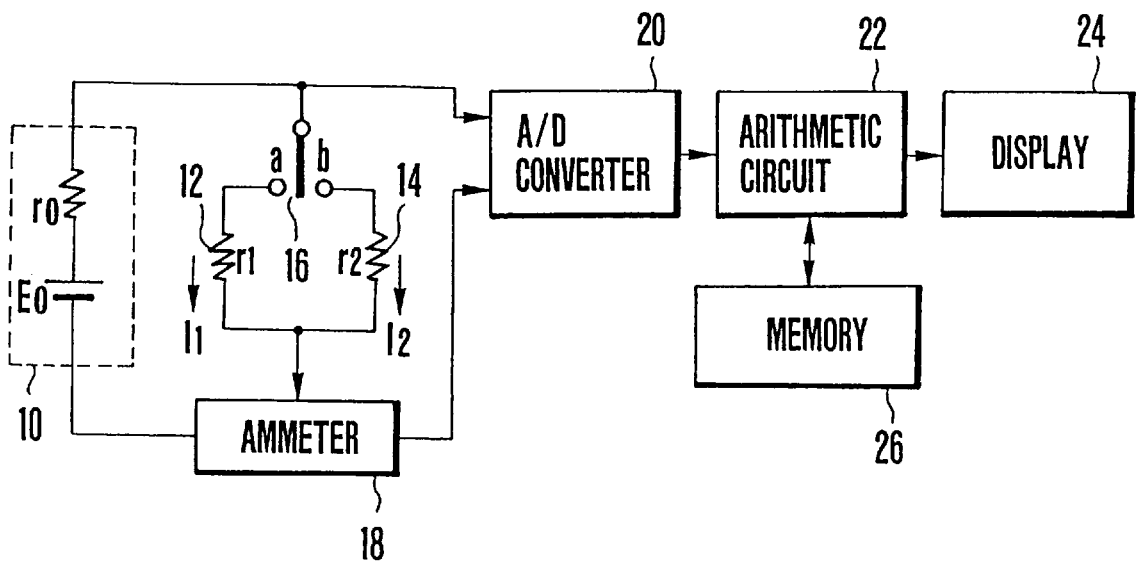
FIG. 2 is a block diagram showing the arrangement of a first embodiment of a remaining-amount-of-battery detecting device according to the present invention.

FIG. 2 is a block diagram showing the arrangement of the first embodiment of a remaining-amount-of-battery detecting device according to the present invention. In FIG. 2, a battery to be measured is designated by reference numeral 10. The battery 10 consists of a series circuit formed by an ideal battery portion having an open-circuit voltage E0 and an internal resistor having a resistance r0. Resistors 12 and 14, each of which has a known resistance, are selectively connected to the battery 10 by a switch 16. An ammeter 18 is arranged to output a current signal by measuring a current flowing through the resistor 12 or 14 when the resistor 12 or 14 is connected to the battery 10. An A/D converter 20 digitizes the value of the current measured by the ammeter 18. An arithmetic circuit 22 consists of a microcomputer for controlling the switch 16 and for detecting the extent of charge or discharge of the battery 10 on the basis of the measured current value. A display 24 displays the result of a decision made by the arithmetic circuit 22. A memory 26 stores the data required to detect the extent of charge or discharge of the battery 10.

Figure 3:
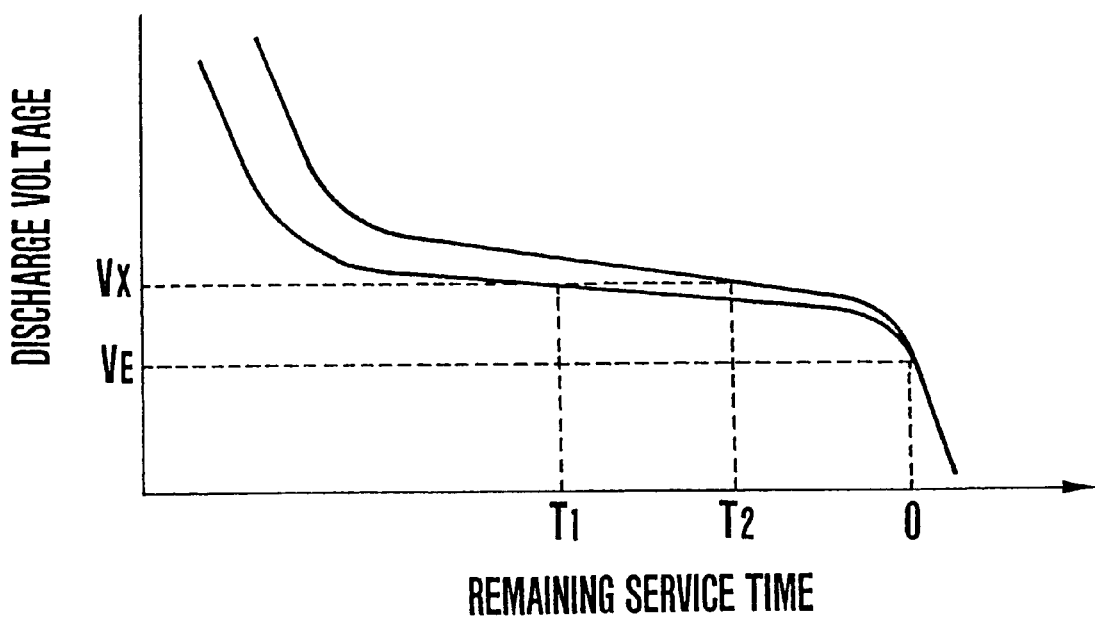
FIG. 3 is a graphic representation showing a discharge characteristic which is obtained when the battery of FIG. 2 is discharged with a predetermined load connected thereto.

FIG. 3 is a graphic representation showing a discharge characteristic which is obtained when the battery 10 of FIG. 2 is discharged with a predetermined load connected thereto. In FIG. 3, the vertical axis represents a discharge voltage, while the horizontal axis represents the remaining amount of battery power in terms of time. As can be seen from FIG. 3, if Ve is the minimum voltage at which an arbitrary apparatus to be used with the battery 10 can operate, when the discharge voltage reaches Ve, the remaining service time of the battery 10 reaches "0". As is known, even if the kinds of batteries used are the same, each individual battery shows a rather large variation in characteristics. Accordingly, even if the discharge voltage is, for example, Vx, the remaining service time will indicate a value of between T1 and T2, depending on the kind of battery to be measured.

Figure 4:
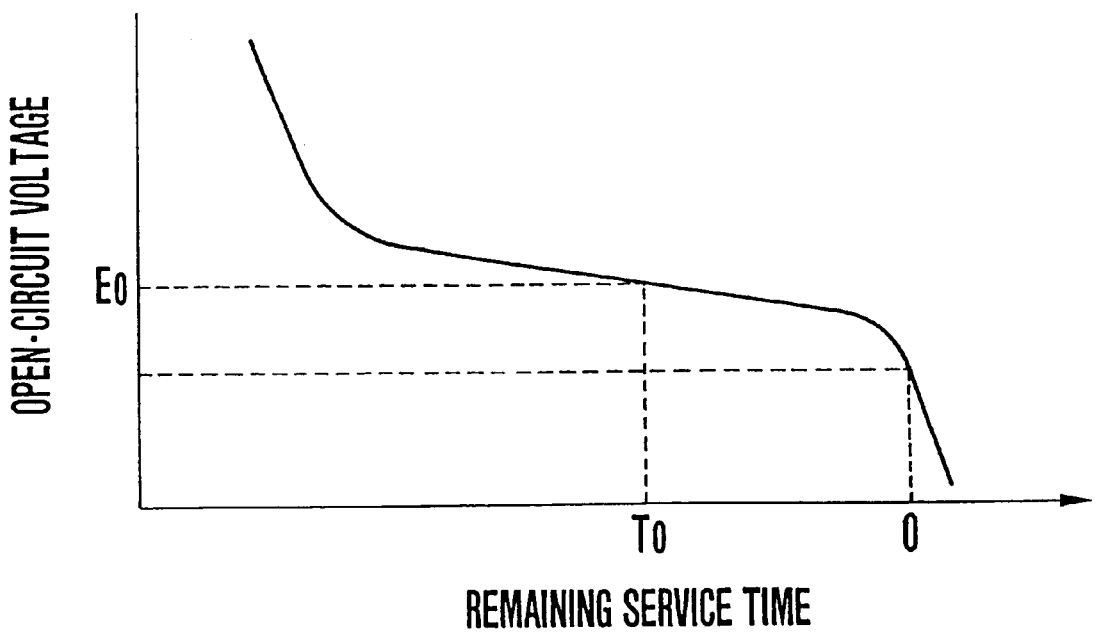
FIG. 4 is a graphic representation showing the characteristic curve of the remaining service time of a battery with respect to an open-circuit voltage.

FIG. 4 is a graphic representation showing the characteristic curve of the remaining service time of a battery with respect to an open-circuit voltage. In FIG. 4, the vertical axis represents the open-circuit voltage, while the horizontal axis represents the remaining service time of the battery, as in FIG. 3. As shown in FIG. 4, with respect to the open-circuit voltage, batteries of the same kind show no large variation in characteristics and, therefore, exhibit discharge characteristics which are substantially the same in quantitative terms. The fact that no large variation appears in the discharge characteristic shown with respect to the open-circuit voltage, basically similarly applies to either of primary and secondary batteries.

The first embodiment is, therefore, intended to convert into data the discharge characteristic based on an open-circuit voltage such as that shown in FIG. 4, store the data in the memory 26, and quantitatively detect the extent of charge or discharge of the battery 10. The method of converting the discharge characteristic of FIG. 4 into data may be, for example, to convert the remaining service time of a battery into an approximate function of an open-circuit voltage or to prepare the remaining service time of a battery relative to an open-circuit voltage in the form of table data and read, from the table, data indicative of the remaining service time of the battery corresponding to an obtained open-circuit voltage.

Figure 5:
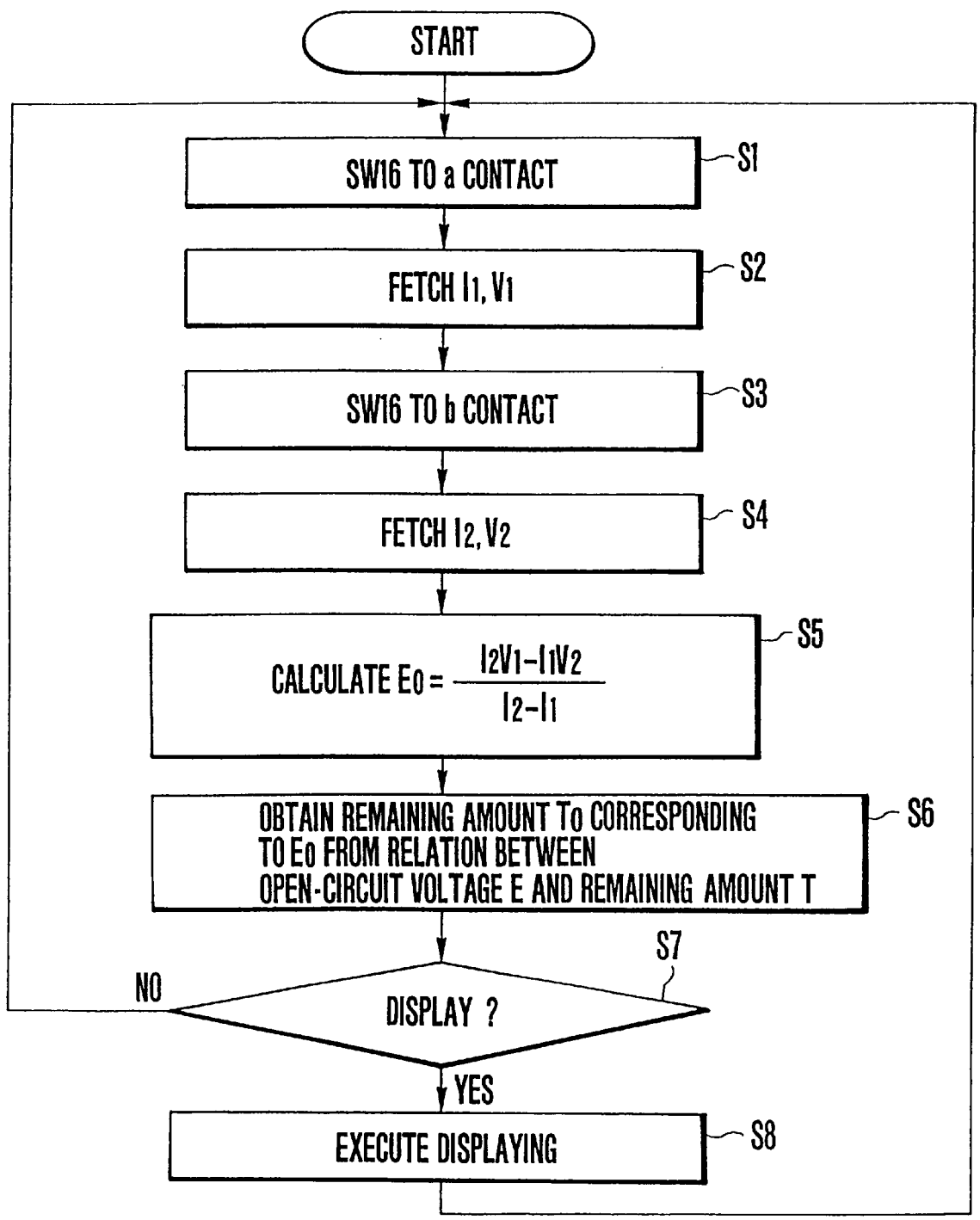
FIG. 5 is an operational flow chart of the arithmetic circuit of FIG. 2.

FIG. 5 shows an operational flow chart of the arithmetic circuit 22 of FIG. 2. The operation of the arithmetic circuit 22 of FIG. 2 will be described below with reference to the operational flow chart shown in FIG. 5. Initially, the arithmetic circuit 22 connects the switch 16 to the shown a contact (Step S1 of FIG. 5), and causes the ammeter 18 to measure a current I1 flowing through the resistor 12. The measured current I1 is digitized by the A/D converter 20 and fetched by the arithmetic circuit 22. The arithmetic circuit 22 calculates an interterminal voltage V1 of the battery 10 from the resistance r1 of the resistor 12 and the measured current I1 (Step S2 of FIG. 5). Then, the switch 16 is connected to the shown b contact (Step S3 of FIG. 5), and the arithmetic circuit 22 fetches the value of a current I2 flowing through the resistor 14 and calculates an interterminal voltage V2 of the battery 10 from the resistance r2 and the value of the current I2 (Step S4 of FIG. 5). The open-circuit voltage E0 is calculated by the following equation from I1, I2, V1 and V2, which have been obtained in Steps S2 and S4 of FIG. 5 in the above-described manner (Step S5 of FIG. 5):

$$E_0 = V_1 + I_1 \cdot r_0$$
$$= V_2 + I_2 \cdot r_0$$
$$= (I_2 V_1 - I_1 V_2)/(I_2 - I_1)$$

where r0=(V1−V2)/(I2−I1)

The thus-obtained open-circuit voltage E0 is compared with data indicative of the remaining service time T of the battery 10 corresponding to an open-circuit voltage E which data is stored in the memory 26 as described above (refer to FIG. 4), and the remaining service time T0 of the battery 10 corresponding to the open-circuit voltage E0 is obtained (Step S6 of FIG. 5). If display is to be provided (Step S7 of FIG. 5), the display 24 displays the remaining service time T0. of the battery 10 in a predetermined manner (Step S8 of FIG. 5).

By recurringly performing the above-described operations, it is possible to quantitatively find the remaining service time of the battery 10.

Figure 6:
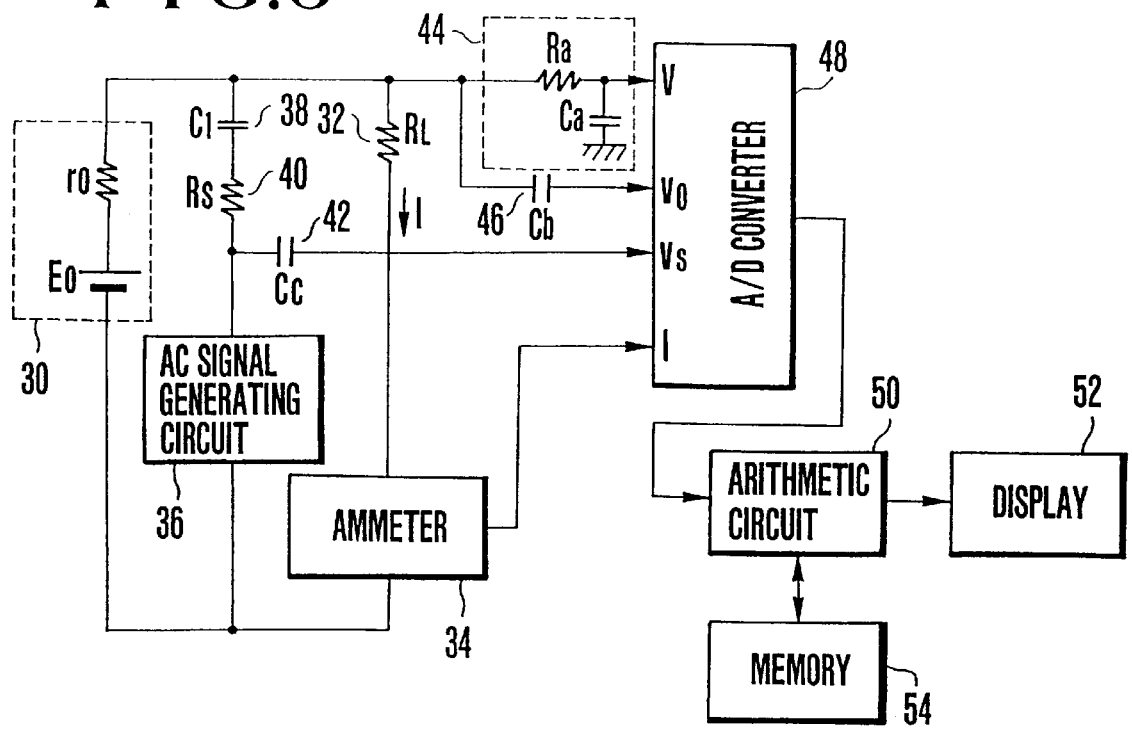
FIG. 6 is a block diagram showing the arrangement of a second embodiment of the remaining-amount-of-battery detecting device according to the present invention.

FIG. 6 is a block diagram showing the arrangement of a second embodiment of the remaining-amount-of-battery detecting device according to the present invention. In the arrangement shown in FIG. 6, as in the case of the battery 10, a battery 30 consists of a series circuit formed by an ideal battery portion having an open-circuit voltage E0 and an internal resistor having a resistance r0. A resistor 32 is a load resistor having a resistance Rl, and an ammeter 34 measures a current I flowing through the load resistor 32. An AC signal generating circuit 36 generates an AC signal having a predetermined amplitude. A capacitor 38 has a capacitance C1 which is sufficient to ignore a reactance for an AC signal. The output impedance of the AC signal generating circuit 36 is designated by reference numeral 40. A capacitor 42 cuts off a DC component, a low-pass filter 44 cuts off an AC component, and a capacitor 46 cuts off a DC component.

An A/D converter 48 digitizes an interterminal voltage V of the battery 30 (the output from the low-pass filter 44), a voltage drop vo across the load resistor 32 and the battery 30 in an AC signal (the amplitude of an AC signal supplied from the capacitor 46), the amplitude vs of the AC signal outputted from the AC signal generating circuit 36 (the amplitude of an AC signal supplied from the capacitor 42) and the value of the current I flowing through the load resistor 32, measured by the ammeter 34. An arithmetic circuit 50 consists of a microcomputer for calculating the remaining service time of the battery 30 from the data outputted from the A/D converter 48. A display 52 displays the remaining service time of the battery 30 calculated by the arithmetic circuit 50. A memory 54 is similar to the memory 26 shown in FIG. 2, and stores data on the discharge characteristic of the battery 30.

Figure 7:
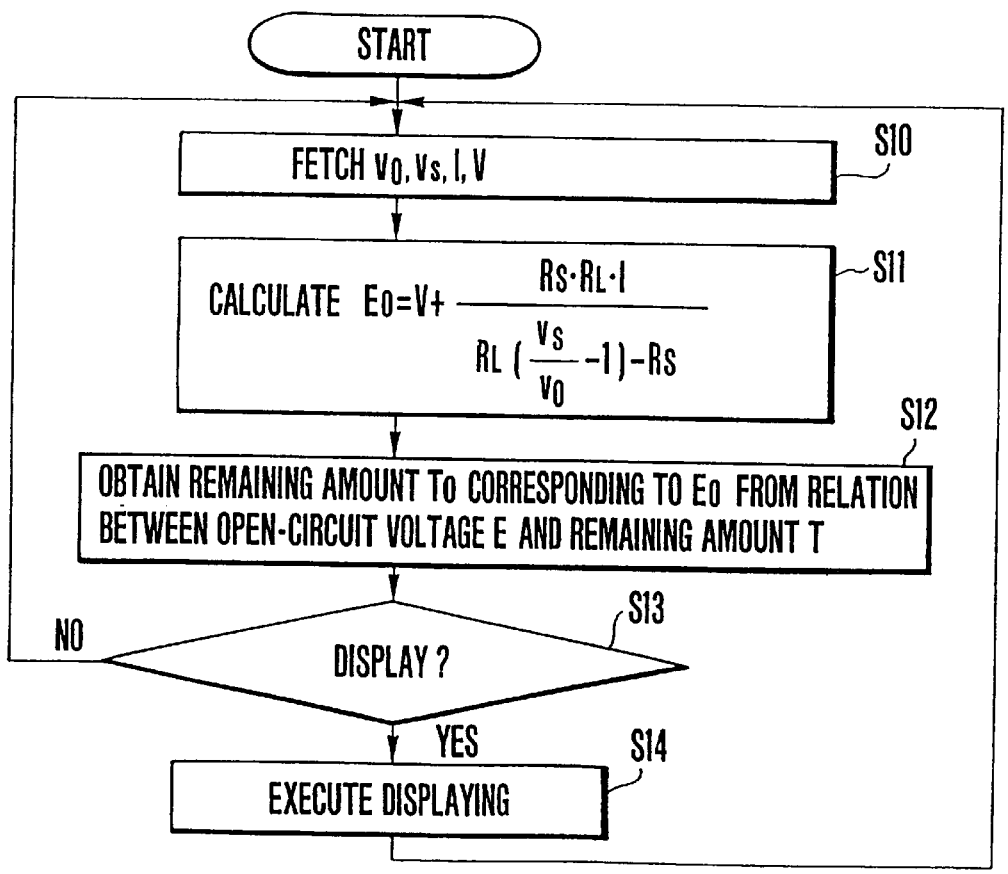
FIG. 7 is an operational flow chart showing the operation of the device shown in FIG. 6.

FIG. 7 shows an operational flow chart of the device of FIG. 6. The operation of the device shown in FIG. 6 will be described below with reference to the operational flow chart shown in FIG. 7.

Referring back to FIG. 6, the AC signal vs outputted from the AC signal generating circuit 36 is applied to the battery 30 (and the load resistor 32) through the output impedance 40 and the capacitor 38. If v0 is a voltage drop across the internal resistor r0 of the battery 30 (and the load resistor 32), the internal resistor r0 is obtained from the following equation:

$$r_O = \frac{R_S \cdot R_L}{R_L(v_S/v_O - 1) - R_S}$$

Since the resistor 32 having the resistance Rl is connected across the battery 30, the open-circuit voltage E0 of the battery 30 is obtained from the following equation:

$$E_0 = V + I \cdot r_O$$
$$= V + \frac{R_S \cdot R_L}{R_L(v_S/v_O - 1) - R_S} I$$

where I is the DC current flowing through the resistor 32 and V is the interterminal voltage of the battery 30. These values of v0, vs, V and I are digitized by the A/D converter 48 and supplied to the arithmetic circuit 50. The arithmetic circuit 50 fetches these data (Step S10 of FIG. 7) and calculates the open-circuit voltage E0 (Step S11 of FIG. 7). As in the case of Step S6 of FIG. 5, the remaining service time T0 of the battery 30 corresponding to the open-circuit voltage E0 is obtained by making reference to the discharge characteristic data stored in the memory 54 (Step S12 of FIG. 7). If display is to be provided (Step S13 of FIG. 7), the display 52 displays the remaining service time T0 of the battery 30 (Step S14 of FIG. 7).

Although the second embodiment has been explained with reference to a secondary battery, it can, of course, be applied to detection of the remaining amount of battery power of a primary battery.

As described above, according to the second embodiment, it is possible to quantitatively grasp the remaining amount of battery power.

A third embodiment of the present invention will be described below with reference to FIGS. 8 to 11.

Figure 8:
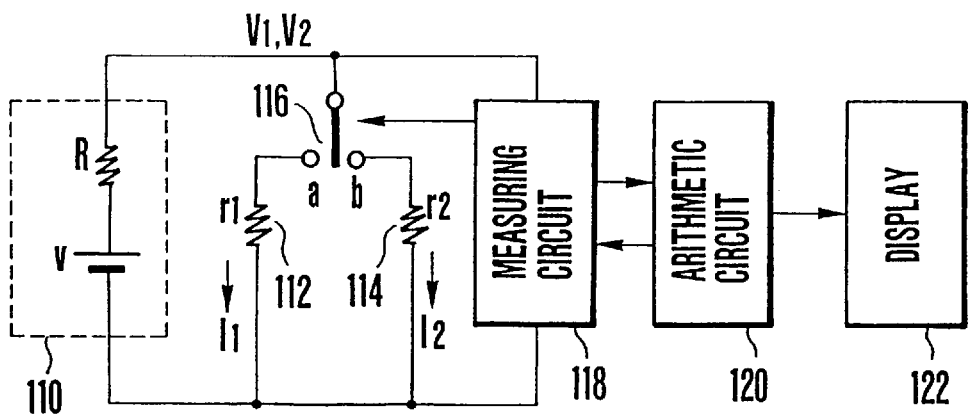
FIG. 8 is a block diagram showing the arrangement of a third embodiment of the remaining-amount-of-battery detecting device according to the present invention.

FIG. 8 is a block diagram showing the arrangement of the third embodiment of the remaining-amount-of-battery detecting device according to the present invention. In FIG. 8, a battery to be measured is designated by reference numeral 110. The battery 110 consists of a series circuit formed by an ideal battery portion having an open-circuit voltage v and an internal resistor having a resistance R. Resistors 112 and 114 which respectively have known resistances r1 and r2 are selectively connected to the battery 110 by a switch 116. A measuring circuit 118 controls the switch 116 and measures an interterminal voltage V1 or V2 of the battery 110 and a current I1 or I2 flowing through the resistor 112 or 114 when the resistor 112 or 114 is connected to the battery 110. (The current I1 or I2 may be calculated from the voltage V1 or V2.) An arithmetic circuit 120 performs communication with the measuring circuit 118 to receive measurement data from the measuring circuit 118 and performs arithmetic operations which will be described later and, in addition, transmits a control signal to the measuring circuit 118. A display 122 displays information such as the remaining service time of the battery 110 calculated by the arithmetic circuit 120.

Figure 9:
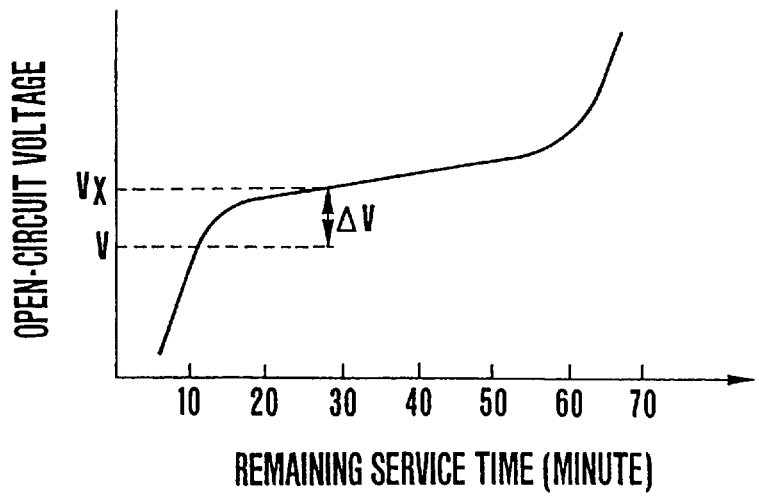
FIG. 9 is a graphic representation showing the characteristic curve of the remaining service time of a battery with respect to an open-circuit voltage.

The open-circuit voltage exhibits a characteristic such as that shown in FIG. 9 with respect to the remaining service time, and if service temperature is fixed, each individual battery shows no large variation in characteristics. In FIG. 9, the vertical axis represents the open-circuit voltage, while the horizontal axis represents the remaining amount of battery power in terms of time. Although details are described later, the arithmetic circuit 120 shown in FIG. 8 holds the characteristic of FIG. 9 in the form of data.

Figure 10:
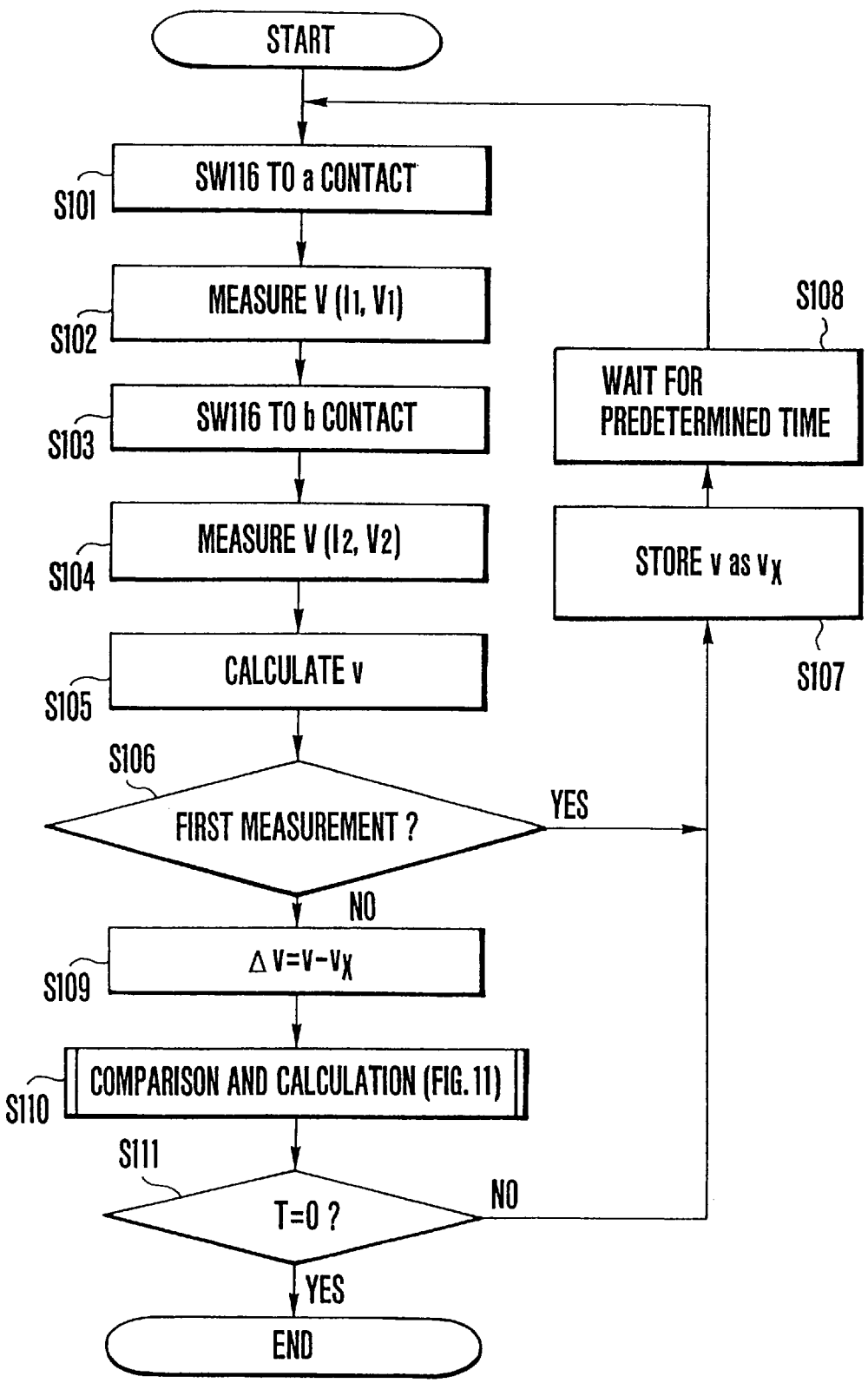
FIG. 10 is an operational flow chart showing the operation of the device shown in FIG. 8.

FIG. 10 shows an operational flow chart of the device shown in FIG. 8. The operation of the device shown in FIG. 8 will be described below with reference to the operational flow chart shown in FIG. 10.

Referring back to FIG. 8, the arithmetic circuit 120 transmits a control signal to the measuring circuit 118 to connect the switch 116 to the shown a contact (a side on which the load resistor 112 is connected) (Step S101 of FIG. 10), and measures a current I1 flowing through the resistor 112 and an interterminal voltage V1 of the battery 110 (Step S102 of FIG. 10). The measurement data obtained by the measuring circuit 118 is transmitted to the arithmetic circuit 120. Then, the arithmetic circuit 120 transmits a control signal to the measuring circuit 118 to connect the switch 116 to the shown b contact (a side on which the load resistor 114 is located) (Step S103 of FIG. 10), and measures a current I2 flowing through the resistor 114 and an interterminal voltage V2 of the battery 110 (Step S104 of FIG. 10). The obtained measurement data is also transmitted to the arithmetic circuit 120. The arithmetic circuit 120 calculates the open-circuit voltage v of the battery 110 by the following equation from I1, I2, V1 and V2, which have been measured in Steps S102 and S104 of FIG. 10:

$$v = V_1 + I_1 \cdot R$$
$$= V_2 + I_2 \cdot R$$
$$= (I_2 V_1 - I_1 V_2)/(I_2 - I_1)$$

where R=(V1−V2)/(I2−I1).

Then, in Step S106 of FIG. 10, it is determined whether the open-circuit voltage v has been calculated by the first cycle of arithmetic operation following the activation of the device. If the calculation has been performed by the first cycle of arithmetic operation, the value of the open-circuit voltage v calculated in Step S105 of FIG. 10 is stored as a variable vx (Step S107 of FIG. 10). After a wait of a predetermined time (Step S108 of FIG. 10), the process returns to Step S101 of FIG. 10 to again calculate the open-circuit voltage v.

In the second cycle of arithmetic operation for obtaining the open-circuit voltage v (Step S106 of FIG. 10), the previously calculated and stored open-circuit voltage vx is subtracted from the currently calculated open-circuit voltage v (Step S107 of FIG. 10), whereby a variance Δv indicative of the result of the subtraction is obtained (Step S109 of FIG. 10). Then, the arithmetic circuit 120 calculates the remaining service time T of the battery 110 in accordance with a comparing and calculating subroutine for finding the remaining service time T of a battery (to be described later). The display 122 displays the result (Step S110 of FIG. 10). If the calculated remaining service time T is "0", the remaining-amount-of-battery detecting operation is completed. If the calculated remaining service time T is not "0", the process proceeds to Step S107 of FIG. 10 (Step S110 of FIG. 10). In Step S107 of FIG. 10, the calculated open-circuit voltage v is stored as the variable vx. After a wait of a predetermined time (Step S108 of FIG. 10), the process returns to Step S101 of FIG. 10 to again calculate the open-circuit voltage v.

Figure 11:
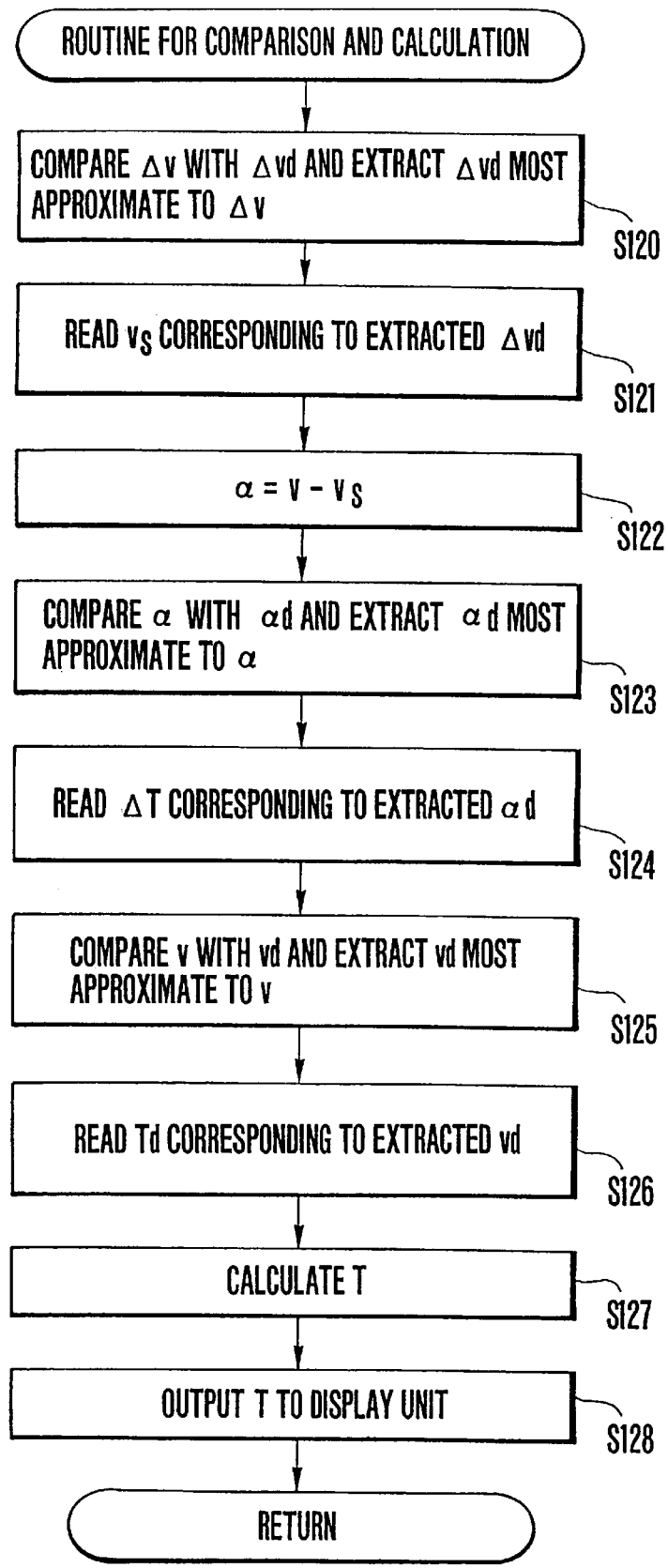
FIG. 11 is a flow chart showing a comparing and calculating subroutine for finding the remaining service time of the battery.

FIG. 11 is a flow chart showing the comparing and calculating subroutine for finding the remaining service time T of a battery. The arithmetic circuit 120 holds the data of Tables 1 and 2, obtained from the characteristic shown in FIG. 9, in a table memory or the like (not shown). The arithmetic circuit 120 compares Δv with the difference open-circuit voltage data Δvd shown in Table 1 and reads Δvd, which is most approximate to Δv, and corresponding reference open-circuit voltage data vs (Steps S120 and S121 of FIG. 11). Then, a reference deviation α(=v−vs) is calculated from these data (Step 122 of FIG. 11).

The arithmetic circuit 120 compares this reference deviation a with the reference deviation data ad shown in Table 2, and reads from the memory table reference deviation data αd, which is most approximate to the reference deviation α, and corresponding corrected time data ΔT (Steps S123 and S124 of FIG. 11). The arithmetic circuit 120 also compares the open-circuit voltage v with the reference voltage data vd shown in Table 3, and reads from the memory table the most approximate voltage data vd and corresponding reference remaining service time Td (Steps S125 and S126 of FIG. 11). The remaining service time T of the battery 110 is calculated from the thus-obtained data by the following equation (Step 127 of FIG. 11):

$$T = T_d - \Delta T$$

The arithmetic circuit 120 supplies the obtained remaining service time T to the display 122 to display it in a predetermined manner, for example, to display it as the remaining amount or the amount used (Step S128 of FIG. 11).

TABLE 1

| DIFFERENCE OPEN-CIRCUIT VOLTAGE ΔVd | REFERENCE OPEN-CIRCUIT VOLTAGE vs |
|---|---|
| 1.00 | 5.8 |
| 0.99 | 5.9 |
| . | . |
| . | . |
| . | . |
| 0.01 | 6.38 |

TABLE 2

| REFERENCE DEVIATION αd | CORRECTED TIME ΔT |
|---|---|
| −1.00 | −10 |
| −0.99 | −9 |
| . | . |
| . | . |
| . | . |
| 1.00 | 10 |

TABLE 3

| REFERENCE VOLTAGE Vd | REFERENCE REMAINING SERVICE TIME Td |
|---|---|
| 6.90 | 50 |
| 6.89 | 49 |
| . | . |
| . | . |
| . | . |
| 5.60 | 0 |

Figure 12:
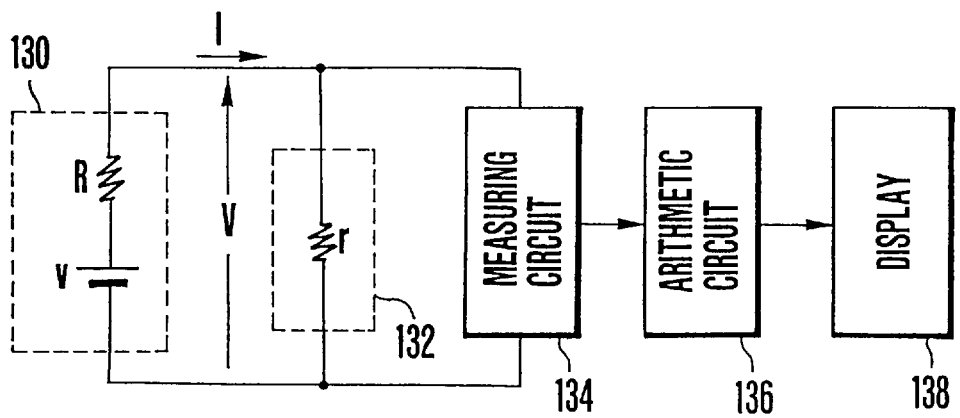
FIG. 12 is a block diagram showing the arrangement of a fourth embodiment of the remaining-amount-of-battery detecting device according to the present invention, in which a battery is connected to a load whose resistance varies with the operating state thereof.

FIG. 12 is a block diagram showing the arrangement of a fourth embodiment of the remaining-amount-of-battery detecting device according to the present invention, in which a battery is connected to a load whose resistance varies with the operating state thereof.

In FIG. 12, a battery to be measured is designated by reference numeral 130. A load circuit 132 has a resistance which varies with the operating state thereof. A measuring circuit 134 measures an interterminal voltage V of the battery 130 and a current I flowing through the load circuit 132. An arithmetic circuit 136 calculates an open-circuit voltage by using the measurement data provided by the measuring circuit 134, and obtains the remaining service time T of the battery 130 in a manner similar to that of the arithmetic circuit 120 explained in connection with FIG. 8. A display is designated by reference numeral 138.

Figure 13:
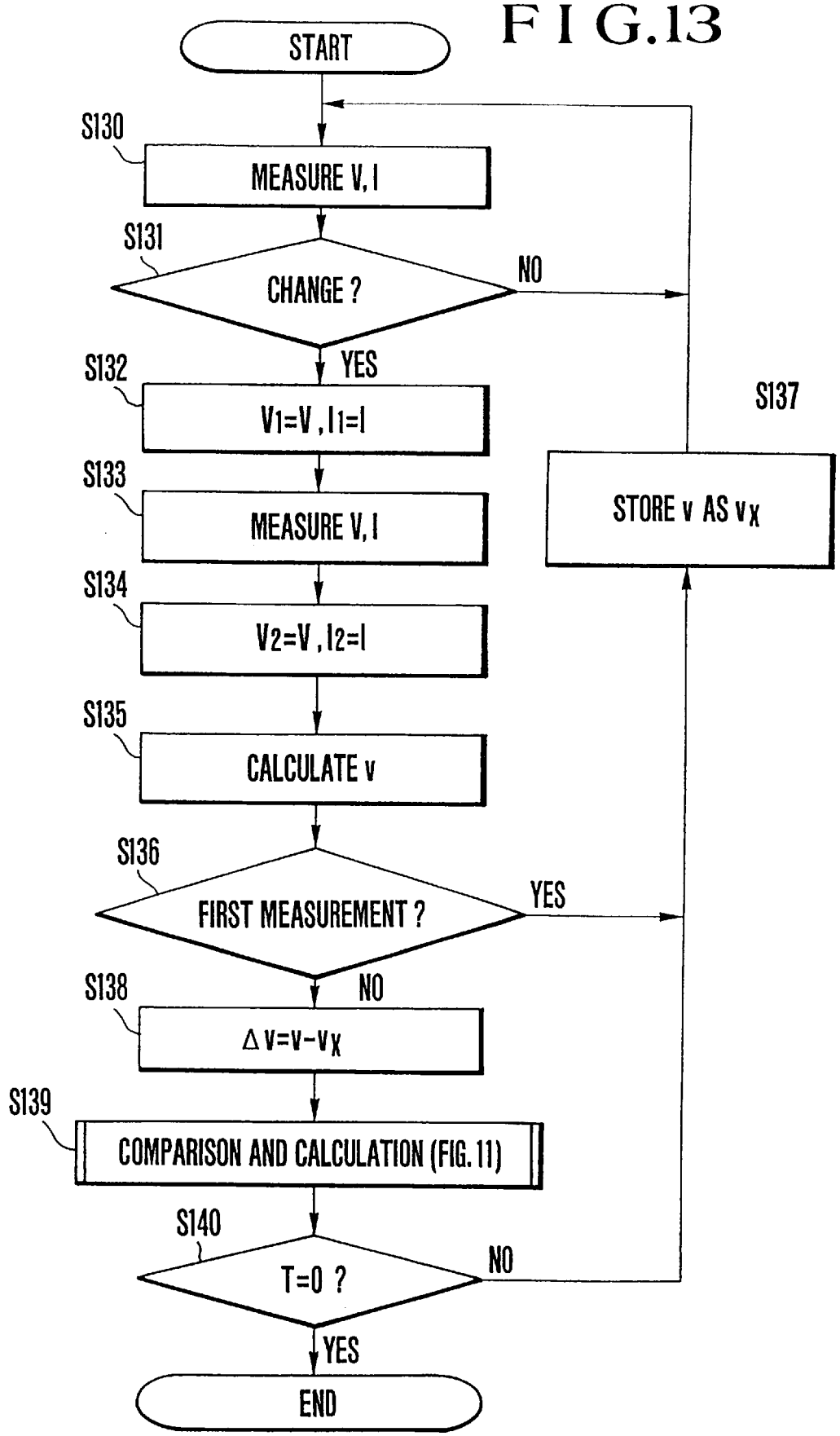
FIG. 13 is an operational flow chart showing the operation of the device shown in FIG. 12.

FIG. 13 shows an operational flow chart of the device shown in FIG. 12. The operation of the device shown in FIG. 12 will be described below with reference to the operational flow chart shown in FIG. 13.

Referring back to FIG. 12, the arithmetic circuit 134 constantly measures the current I produced by the load resistance r of the load circuit 132, and the interterminal voltage V of the battery 130 (Step S130 of FIG. 13). If the load resistance r varies (Step S131 of FIG. 13), the measured values of I and V before variation are stored as variables I1 and V1 (Step S132 of FIG. 13) and the measured value of I and V after variation are stored as variables I2 and V2 (Steps S133 and S134 of FIG. 13). Then, the open-circuit voltage v is calculated from these measured values I1, V1, I2 and V2 by the equation used in the third embodiment (Step S135 of FIG. 13). If the load resistance r varies for the first time after the activation of the device (Step S136 of FIG. 13), the calculated open-circuit voltage v is stored as a variable vx (Step S137 of FIG. 13). The process returns to Step S130 of FIG. 13, where it waits until the next variation occurs in the load resistance r. In the second measurement and the following (Step S136 of FIG. 13), Δv (=v−vx) is calculated (Step S138 of FIG. 13) and the remaining service time T is calculated from this Δv in accordance with the comparing and calculating subroutine for finding the remaining service time T of a battery (refer to FIG. 11). The display 138 displays the result (Step S140 of FIG. 13). If the calculated remaining service time T is "0", the remaining-amount-of-battery detecting operation is completed. If the calculated remaining service time T is not "0", the open-circuit voltage v is stored as the variable vx (Step S137 of FIG. 13). The process returns to Step S130 of FIG. 13 and waits until the next variation occurs in the load resistance r.

As a matter of course, the fourth embodiment can be applied to not only a secondary battery but a primary battery.

As described above, according to the fourth embodiment, it is possible to quantitatively detect and display the remaining amount of battery power with high precision without being influenced by variations in the discharge characteristics of individual batteries. In addition, since the difference value of an open-circuit voltage greatly varies with the remaining service time of a battery, a more accurate value of the remaining amount of battery power can be obtained by correcting the obtained value of the remaining amount of battery power with the difference value of the open-circuit voltage.

A fifth embodiment of the present invention will be described below with reference to FIGS. 14 to 22.

Figure 14:
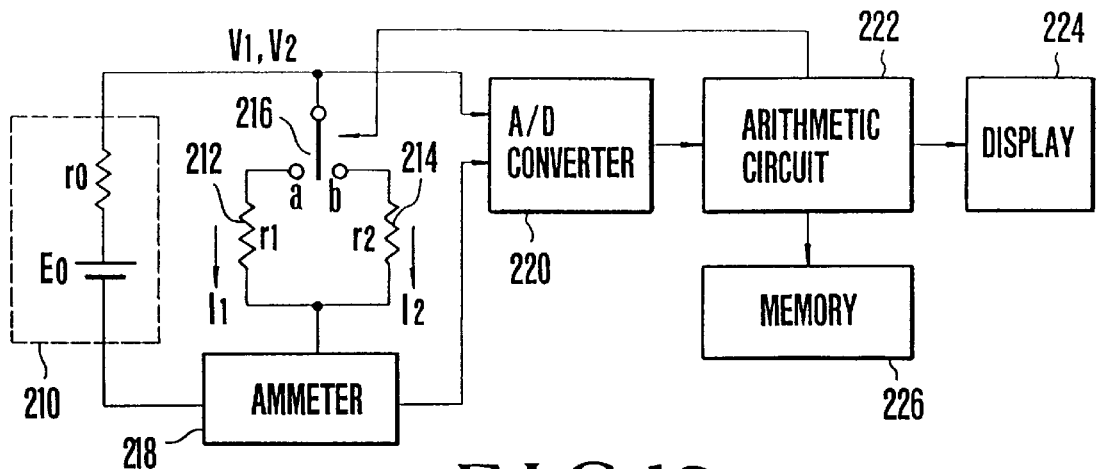
FIG. 14 is a block diagram showing the arrangement of a fifth embodiment of the remaining-amount-of-battery detecting device according to the present invention.

FIG. 14 is a block diagram showing the arrangement of the fifth embodiment of the remaining-amount-of-battery detecting device according to the present invention. In FIG. 14, a battery to be measured is designated by reference numeral 210. The battery 210 consists of a series circuit formed by an ideal battery portion having an open-circuit voltage (internal electromotive voltage) E0 and an internal resistor having a resistance r0. Resistors 212 and 214, each of which has a known resistance, are selectively connected to the battery 210 by a switch 216. An ammeter 218 measures a current I1 or I2 flowing through the resistor 212 or 214 if the resistor 212 or 214 is connected to the battery 210, converts it into a current-value signal, and outputs this signal. An A/D converter 220 digitizes the discharge voltage V1 or V2 of the battery 210 based on the load resistor 212 or 214 and digitizes a signal indicative of the constant-current value measured by the ammeter 218. An arithmetic circuit 222 consists of a microcomputer for controlling the switch 216 and for detecting the extent of charge or discharge of the battery 210 by measuring the open-circuit voltage v of the battery 210 from the measured voltage value V1 or V2 and the measured current value I1 or I2. A display 224 provides display of the result of a decision made by the arithmetic circuit 222. A memory 226 stores the data required to detect the extent of charge or discharge of the battery 210.

Referring to FIG. 14, if I1 is the current flowing through the load resistor 212 when the switch 216 is connected to the shown a contact, V1 is the interterminal voltage of the battery 210 provided at this time, I2 is the current flowing through the load resistor 214 when the switch 216 is connected to the shown b contact, V2 is the interterminal voltage of the battery 210 provided at this time, E0 is the open-circuit voltage of the battery 210, and r0 is an internal resistance, the following equation is obtained:

$$E_0 = V_1 + I_1 \cdot r_0$$
$$= V_2 + I_2 \cdot r_0$$
$$= (I_2 V_1 - I_1 V_2) / (I_2 - I_1)$$

where r0=(V1−V2)/(I2−I1).

Figure 15:
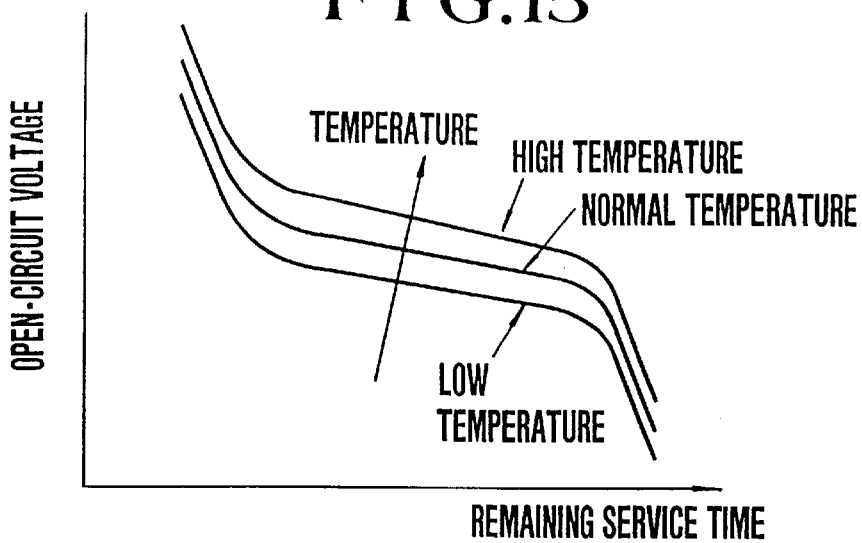
FIG. 15 is a graphic representation showing the discharge characteristic of a Ni-Cd battery to which a predetermined load is connected.

If temperature is constant, individual batteries show no large variations, so that it is possible to accurately detect the remaining amount of battery power by obtaining it on the basis of the open-circuit voltage E0. However, the open-circuit voltage E0 has a temperature characteristic such as that shown in FIG. 15. FIG. 15 is a graphic representation showing the discharge characteristic of a Ni-Cd battery to which a predetermined load is connected. In FIG. 15, the vertical axis represents the open-circuit voltage, while the horizontal axis represents the remaining amount of battery power in terms of time. As shown in FIG. 15, the open-circuit voltage E0 increases in the order: low temperature, normal temperature and high temperature. The fifth embodiment is arranged such that the normal-temperature characteristic curve of FIG. 15 is stored as data in the memory 226 of FIG. 14 and also such that the measured values of voltage and current are corrected for temperature and an open-circuit voltage is calculated from the corrected voltage and current. The thus-calculated open-circuit voltage is compared with the data stored in the memory 226 to quantitatively detect the extent of charge or discharge of the battery 210. To convert the discharge characteristic of FIG. 15 into data, several methods are available, for example, a method of converting the remaining service time of a battery into an approximate function of its open-circuit voltage or a method of tabulating the remaining service time of a battery relative to its open-circuit voltage in a table and reading, from the table, data indicative of the remaining service time of the battery corresponding to the obtained open-circuit voltage.

Figure 16:
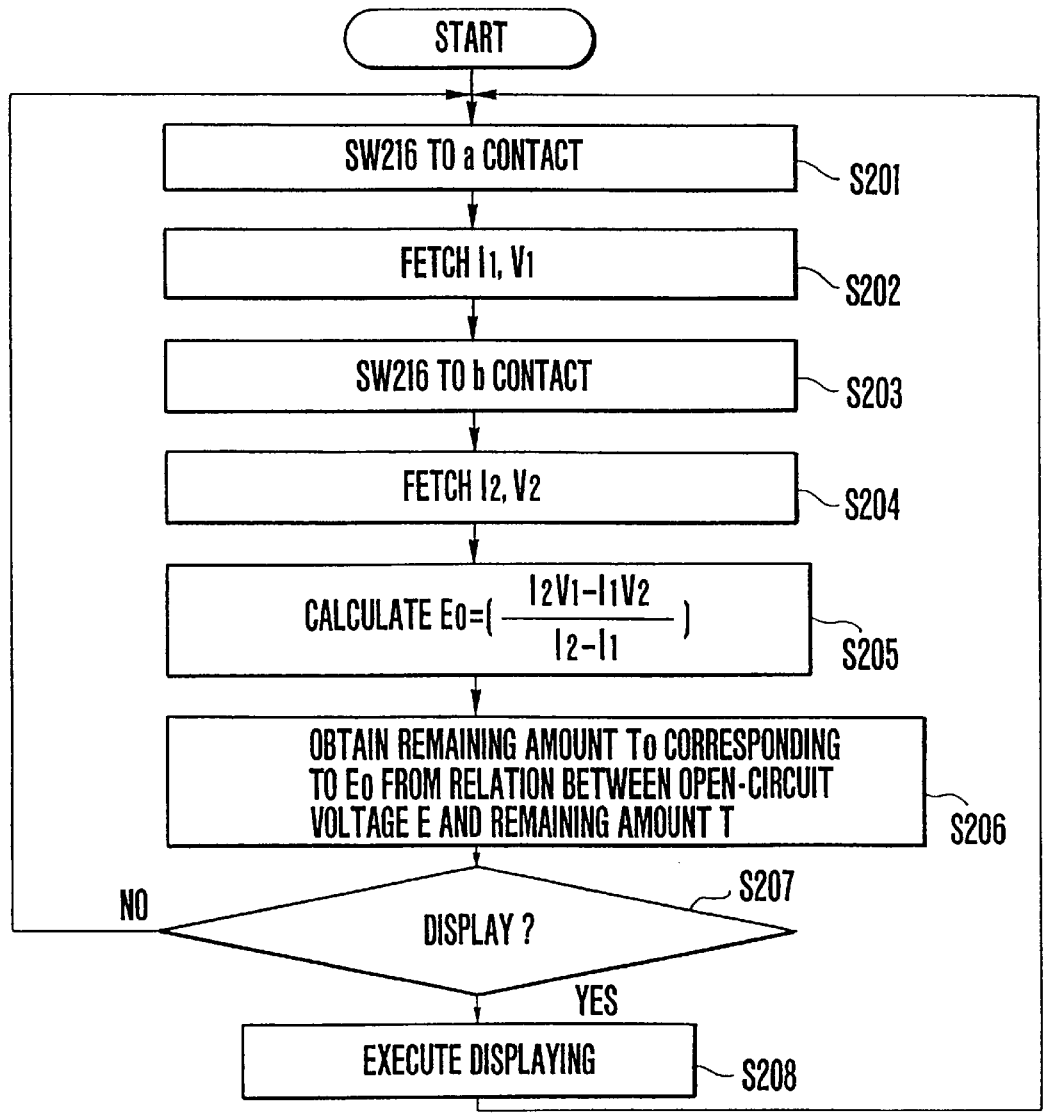
FIG. 16 is an operational flow chart showing the operation of the arithmetic circuit of FIG. 14.

FIG. 16 shows an operational flow chart of the arithmetic circuit 222 of FIG. 14. The operation of the arithmetic circuit 222 of FIG. 14 will be described below with reference to the operational flow chart shown in FIG. 16. Initially, the arithmetic circuit 222 connects the switch 216 of FIG. 14 to the shown a contact (Step S201 of FIG. 16), and fetches the current I1 flowing through the resistor 212 and the interterminal voltage V1 of the battery 210 (Step S202 of FIG. 16). The arithmetic circuit 222 then connects the switch 216 to the shown b contact (Step S203 of FIG. 16), and fetches the current I2 flowing through the resistor 214 and the interterminal voltage V2 of the battery 210 (Step S204 of FIG. 16). The open-circuit voltage E0 is calculated by the above noted equation from I1, I2, V1 and V2, which have been obtained in Steps S202 and S204 (Step S205 of FIG. 16).

The thus-calculated open-circuit voltage E0 is compared with data indicative of the relation between the open-circuit voltage E and the remaining service time T of a battery, which is stored in the memory 226 (refer to FIG. 15), and the remaining service time T0 of the battery 210 corresponding to the open-circuit voltage E0 is obtained (Step S206 of FIG. 16). If display is to be provided (Step S207 of FIG. 16), the display 224 displays the remaining service time T0 of the battery 210 in a predetermined manner (Step S208 of FIG. 16).

By repeatedly performing-the above-described operations, it is possible to quantitatively detect and display the remaining service time of the battery 210.

Figure 17:
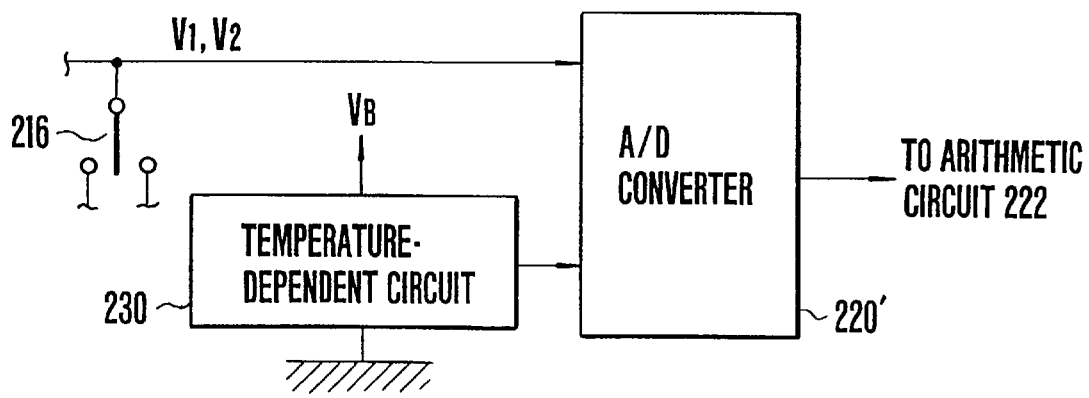
FIG. 17 is a schematic diagram showing a specific arrangement of the A/D converter of FIG. 14.

FIG. 17 is a schematic diagram showing a specific arrangement of the A/D converter 220 of FIG. 14. The A/D converter 220' of FIG. 17 compares the interterminal voltage V1 or V2 of the battery 210 with a comparative reference voltage corrected for temperature by the temperature-dependent circuit 230 of FIG. 17 and digitizes the interterminal voltage V1 or V2.

Figure 18:
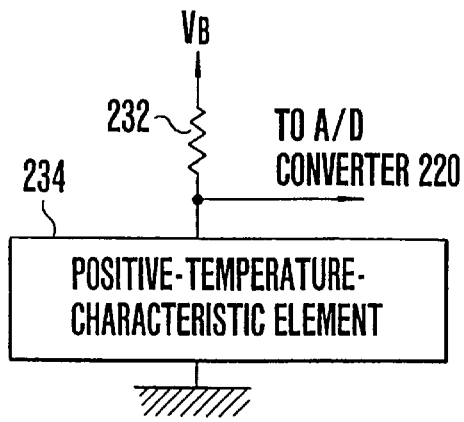
FIGS. 18 and 19 are schematic diagrams showing different examples of the circuit arrangement of the temperature-dependent circuit of FIG. 17.
Figure 19:
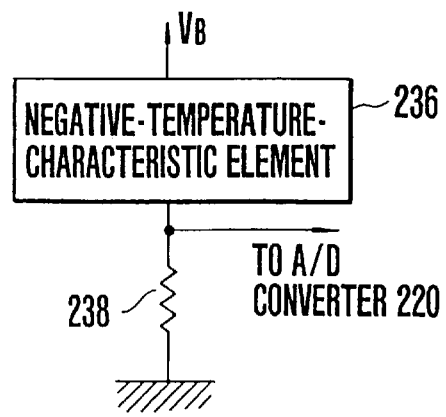

FIGS. 18 and 19 show different examples of the circuit arrangement of the temperature-dependent circuit of FIG. 17. In the circuit arrangement of FIG. 18, a predetermined resistor 232 and a positive-temperature-characteristic element (e.g., a positive-characteristic thermistor) 234, the resistance of which increases with an increase of temperature, are connected in series to apply the DC voltage Vb, thereby supplying the voltage provided at the connection of the resistance 232 and the positive-temperature-characteristic element 234 to the A/D converter 220' as a comparative reference voltage. In the circuit arrangement of FIG. 19, a negative-temperature-characteristic element (e.g., a negative-characteristic thermistor) 236, the resistance of which decreases with an increase of temperature, and a predetermined resistor 238 are connected in series to apply a DC voltage Vb, thereby supplying the voltage provided at the connection of the resistance 238 and the negative-temperature-characteristic element 236 to the A/D converter 220 as a comparative reference voltage. As described above, in each of the circuit arrangements shown in FIGS. 18 and 19, as temperature increases, the comparative reference voltage supplied to the A/D converter 220 increases so that the portion of the interterminal voltage of the battery 210 that has increased with the temperature increase can be corrected.

Figure 20:
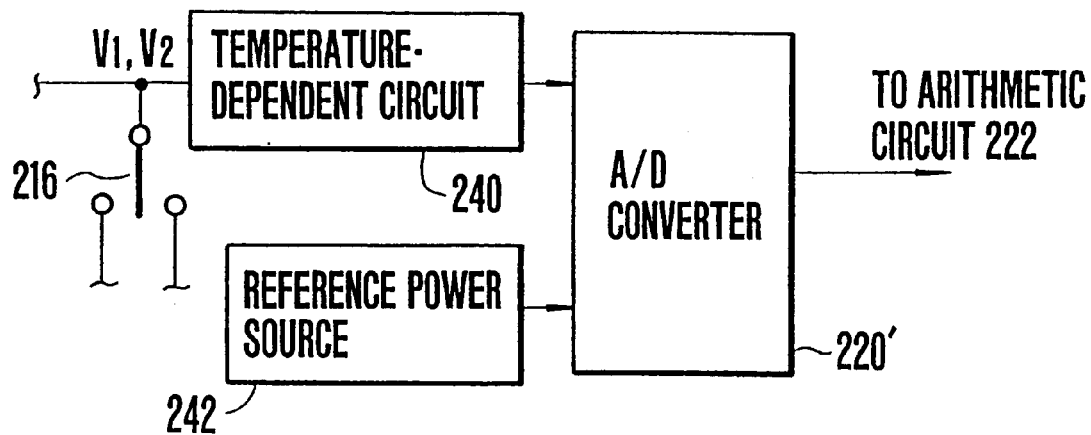
FIG. 20 is a schematic diagram showing another specific example of the arrangement of the A/D converter of FIG. 14.

FIG. 20 shows another specific example of the arrangement of the A/D converter 220 of FIG. 14. As shown in FIG. 20, the interterminal voltage V1 or V2 of the battery 210 of FIG. 14 is supplied to one input of the A/D converter 220' through a temperature-dependent circuit 240, while a reference voltage outputted from a reference power source 242 is supplied to the other input of the A/D converter 220' as a comparative reference voltage.

Figure 21:
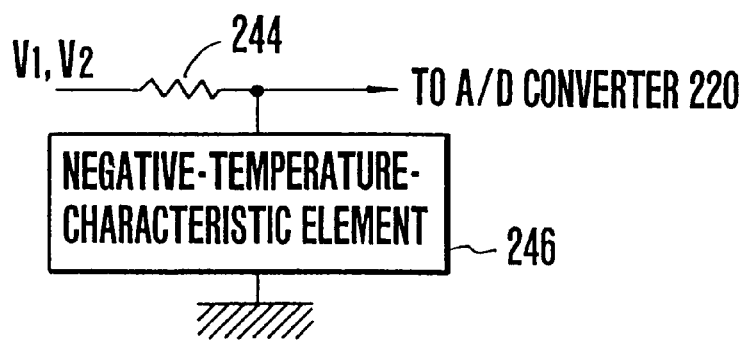
FIGS. 21 and 22 are schematic diagrams showing different examples of the circuit arrangement of the temperature-dependent circuit of FIG. 20.
Figure 22:
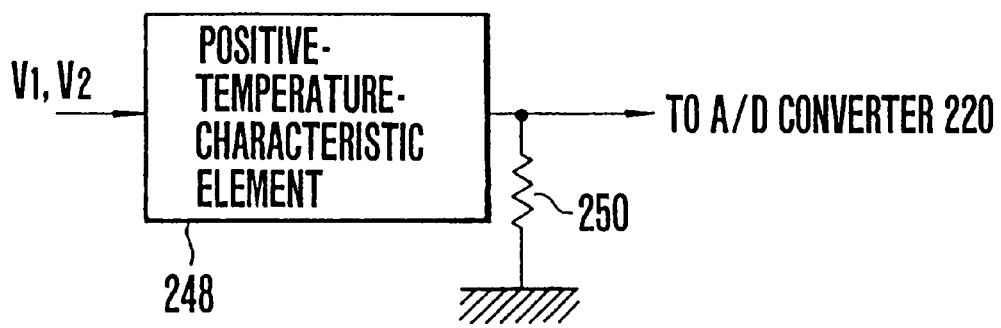

FIGS. 21 and 22 show different examples of the circuit arrangement of the temperature-dependent circuit 240 of FIG. 20. Referring to FIGS. 21 and 22, resistors are designated by reference numerals 244 and 250, a negative-temperature-characteristic element by 246, and a positive-temperature-characteristic element by 248. In each of the circuit arrangements shown in FIGS. 21 and 22, as temperature increases, the interterminal voltage V1 or V2 of the battery 210 of FIG. 14 is decreased by the negative-temperature-characteristic element 246 or the positive-temperature-characteristic element 248, and is supplied to the A/D converter 220'. Accordingly, the portion of the interterminal voltage of the battery 210 that has increased with the temperature increase, is corrected.

Although the fifth embodiment has been explained with reference to a secondary battery, it can, of course, be applied to detection of the remaining amount of battery power of a primary battery.

As described above, according to the fifth embodiment, it is possible to detect and display the remaining amount of battery power accurately and quantitatively without temperature-dependent errors.

A sixth embodiment of the present invention will be described below with reference to FIGS. 23 to 28.

Figure 23:
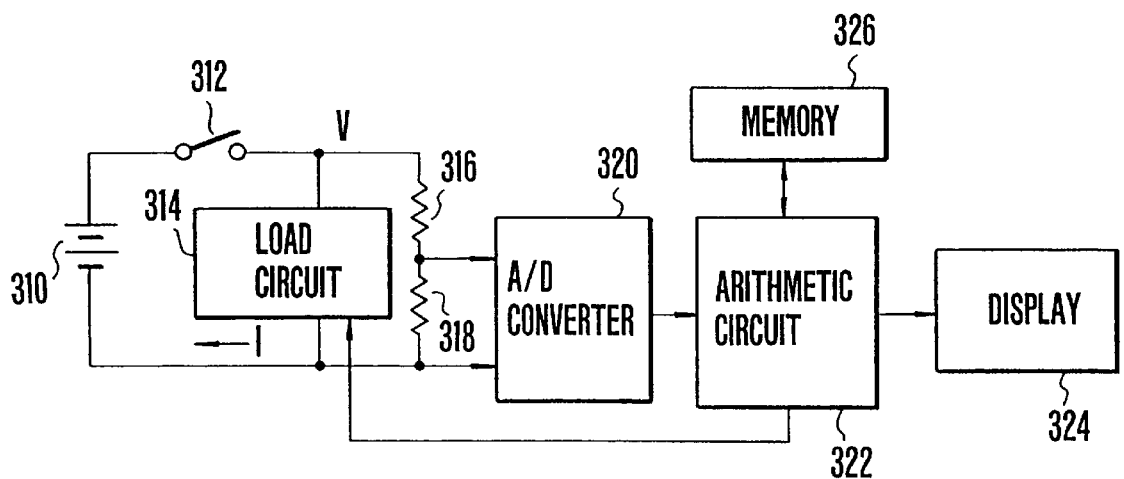
FIG. 23 is a block diagram showing an example of an arrangement in which a sixth embodiment of the present invention is applied to a video camera.

FIG. 23 is a block diagram showing an example of an arrangement in which the sixth embodiment of the present invention is applied to a video camera. The example shown in FIG. 23 includes a battery 310 for use as a power source, a power switch 312, a load circuit 314 for performing the main operations of the video camera, resistors 316 and 318, an A/D converter 320 for digitizing the terminal voltage of the resistor 318, an arithmetic circuit 322 consisting of a microcomputer for performing control of the operation of the video camera and for performing arithmetic operations on the remaining amount of battery power of the battery 310, a display 324 for displaying the remaining amount of battery power obtained by the arithmetic circuit 324, and a memory 326 for storing data such as the discharge characteristic of the battery 310, which will be described later.

Figure 24:
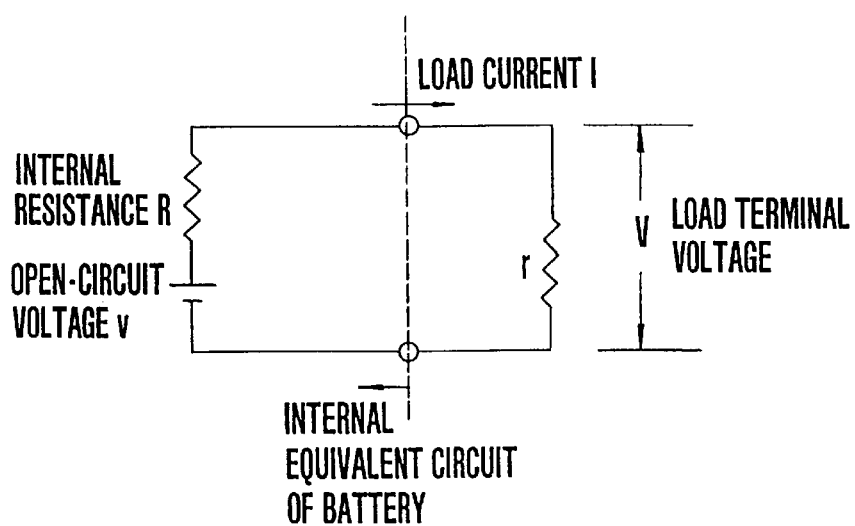
FIG. 24 is a schematic diagram showing a basic circuit for measuring the open-circuit voltage of a battery.

The sixth embodiment is arranged in such a manner that the open-circuit voltage v of the battery 310 is measured by utilizing variations of a load resistance which are based on the difference between the operating modes of the load circuit 314 and the extent to which consumption of the battery 310, is obtained from the open-circuit voltage v, i.e., the remaining amount of battery power. If, as shown in FIG. 24, R represents the internal resistance of the battery 310 of FIG. 24, v the open-circuit voltage, I1 a load current corresponding to a load resistance r1, V1 a load terminal voltage corresponding to the same, I2 a load current corresponding to a load resistance r2, and V2 a load terminal voltage corresponding to the same, the following equations are obtained:

$$R = (V_2 - V_1)/(I_1 - I_2) \qquad (1)$$

$$v = V_2 + I_2 R$$

$$= V_2 + I_2(V_2 - V_1)/(I_1 - I_2)$$

Thus, the open-circuit voltage v of the battery 310 can be calculated.

The above-described voltages V1 and V2 are measured before and after a change from one operating mode to another of the load circuit 314. Since the load resistance r corresponding to each operating mode is known, the currents I1 and I2 relative to the respective voltages V1 and V2 can be obtained in advance. In practice, an interterminal voltage of the resistor 318 is digitized by the A/D converter 320 and inputted to the arithmetic circuit 322, where the digitized value is multiplexed by a predetermined factor to provide the aforesaid values V1 and V2. Then, the open-circuit voltage v is obtained from the thus-obtained parameters V1, V2, I1 and I2 by the above equations. A voltage V across the battery 310 varies depending on a load current because of the presence of various factors such as the internal resistance of the battery 310, a contact resistance at each contact point of the battery 310, the resistance of a lead wire used for connection with a circuit board or the like, with the result that it has generally been impossible to find the accurate remaining amount of battery power. However, since the value of the open-circuit voltage v does not vary with the load current because the internal impedance is zero, it is possible to perform accurate measurement of the remaining amount of battery power.

Figures 25, 28:
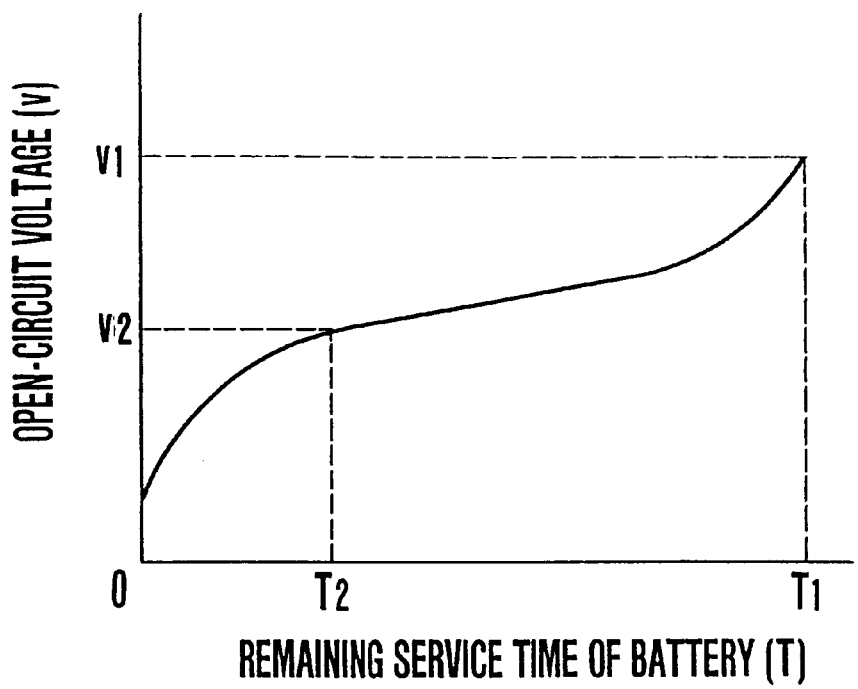
FIG. 25 is a graphic representation showing the relation between an open-circuit voltage and the remaining service time of a battery, which has been obtained through experiments.
FIG. 28 is a timing chart showing a case where an operating mode is changed in the order: a stop mode, a recording-pause mode and a recording mode.

FIG. 25 is a graphic representation showing the relation between the open-circuit voltage v and the remaining service time T of a battery, which has been obtained through experiments. In FIG. 25, the vertical axis represents the open-circuit voltage v, while the horizontal axis represents the remaining service time T. Data relative to the graph shown in FIG. 25 is stored in the memory 326 of FIG. 23, and the open-circuit voltage v is obtained by arithmetic operations from the load terminal voltages and load currents of the battery 310 before and after a change from one operating mode to another. The calculated open-circuit voltage v is compared with the graph shown in FIG. 25 to determine the remaining service time T of the battery 310.

Figure 26:
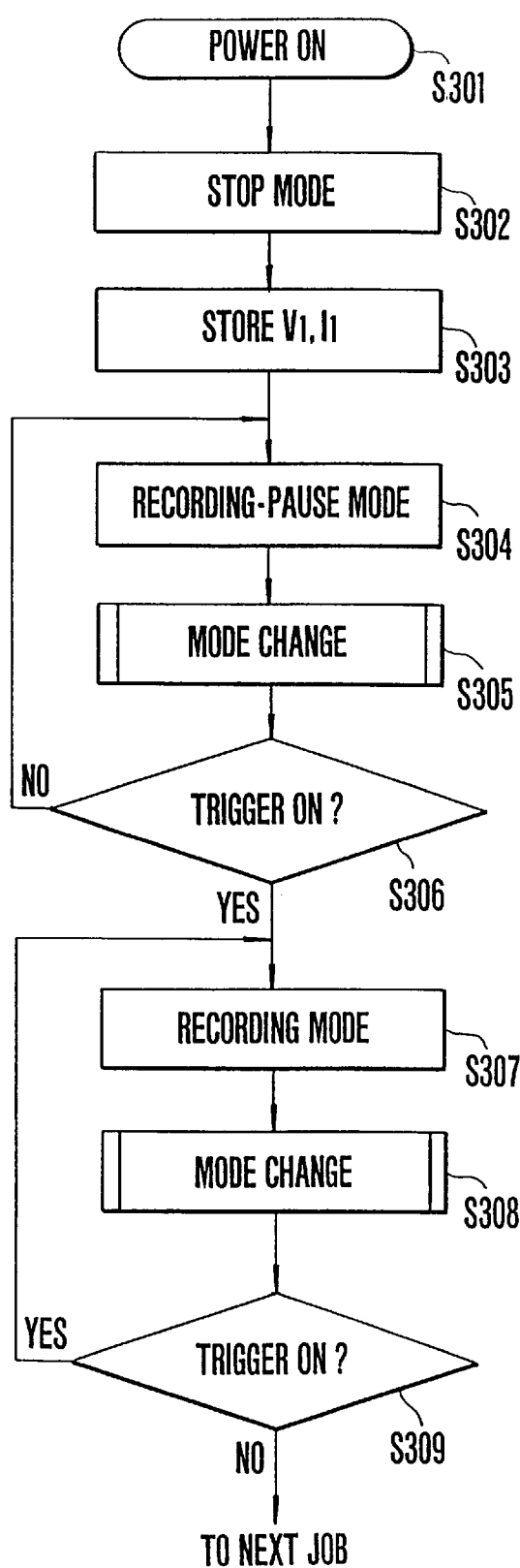
FIG. 26 is an operational flow chart showing the operation of the device of FIG. 23.

FIG. 26 shows an operational flow chart of the device of FIG. 23. The operation of the device shown in FIG. 23 will be described below with reference to the operational flow chart shown in FIG. 26. When the device is energized by switching on the power switch 312 (Step S301 of FIG. 26), the video camera is set to a stop mode (Step S302 of FIG. 26) and the arithmetic circuit 322 measures the load terminal voltage V provided at that time and stores it as a variable V1 and a corresponding load current I as a variable I1 (Step S303 of FIG. 26). Then, the device is set to a recording-pause mode (Step S304 of FIG. 26) and executes the subroutine "MODE CHANGE" corresponding to a change from one operating mode to another (Step S305 of FIG. 26).

Figure 27:
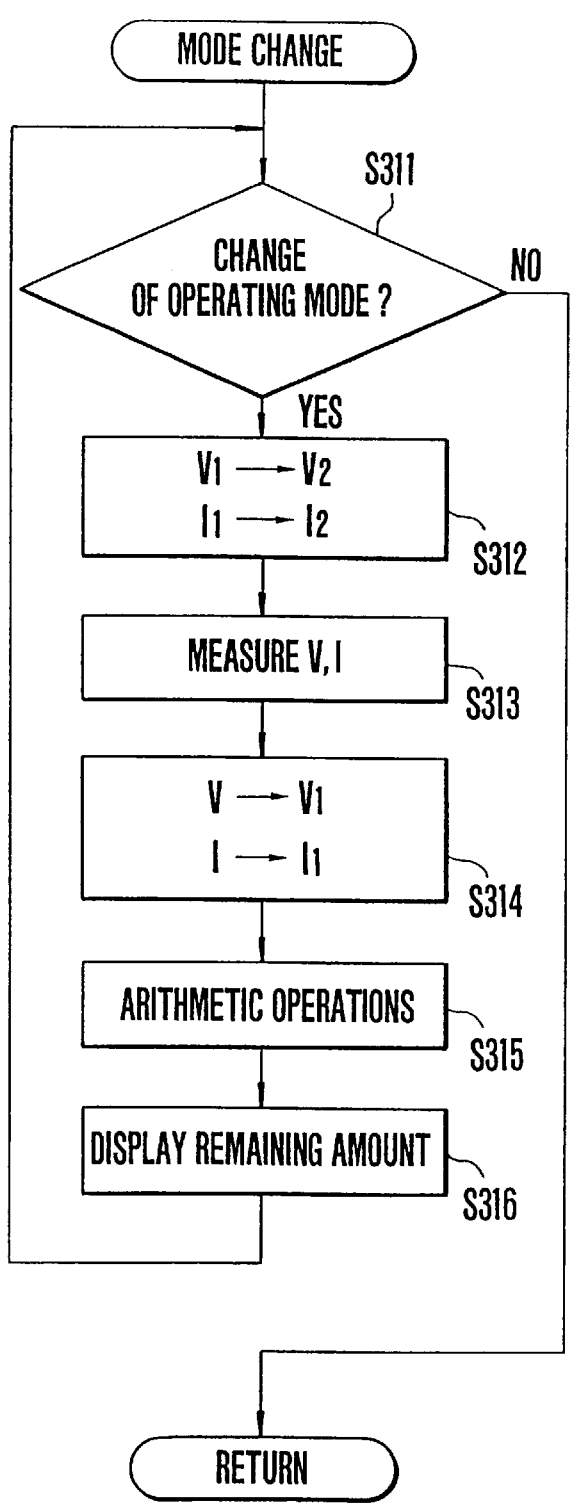
FIG. 27 is a flow chart of the subroutine "MODE CHANGE" shown in FIG. 26.

FIG. 27 shows the flow chart of the subroutine "MODE CHANGE". In the subroutine "MODE CHANGE" of FIG. 27, it is determined whether a change from one operating mode to another has occurred (Step S311 of FIG. 27). If a change from one operating mode to another has occurred, the stored contents of the variables V1 and I1 are respectively transferred to variables V2 and I2 (Step S312 of FIG. 27). Thus, the load terminal voltage V is measured and stored as the variable V1 and the load current I corresponding to the variable V1 is stored as the variable V1 (Steps S313 and S314 of FIG. 27). The obtained variables V1, V2, I1 and I2 are applied to the equations (1) to calculate the open-circuit voltage V. Then, data relative to the graph shown in FIG. 25 is read from the memory 326 and the data is compared with the open-circuit voltage v, thereby obtaining the remaining service time of the battery (Step S315 of FIG. 27). Then, the display 324 displays the remaining service time T of the battery (Step S316 of FIG. 27). It is again determined whether a change from one operating mode to another has occurred, and if no change has occurred, the process returns to the previous operational flow. If a change has occurred, the processing starting at Step S312 of FIG. 26 is performed.

Subsequently to Step S305 of FIG. 26, if the video camera is switched on by pressing a trigger button (not shown) of the video camera (Step S306 of FIG. 26), the device is set to the recording mode (Step S307 of FIG. 26). Since the operating mode is changed from the pause mode to the recording mode, the subroutine "MODE CHANGE" is again executed (Step S308 of FIG. 26) and the remaining service time of battery power in the recording mode is displayed. While the trigger button is pressed, Steps S307, S308 and S309 of FIG. 26 are repeated, and when the trigger button is returned to its OFF position, the process proceeds to the next job.

FIG. 28 is a timing chart showing a case where the operating mode is changed in the order: the stop mode, the recording-pause mode and the recording mode. As shown, the load terminal voltage V1 is measured immediately before the operating mode is changed from the stop mode to the recording-pause mode, and the load terminal voltage V2 is measured immediately after the operating mode has been changed, whereby an open-circuit voltage V1 is obtained. Also, the load terminal voltage V1 is measured immediately before the operating mode is changed from the recording-pause mode to the recording mode, and the load terminal voltage V2 is measured immediately after the operating mode has been changed, whereby a second open-circuit voltage v2 is obtained.

As described above, in the sixth embodiment, variations of the voltage of a load circuit, which are caused by a change from one operating mode to another, are measured, and the remaining amount of battery power is obtained from an open-circuit voltage calculated on the basis of the change. Accordingly, it is possible to obtain the accurate remaining amount of battery power.

Although, in the sixth embodiment, the data relative to the graph shown in FIG. 25 is stored in the memory 326 as it stands, the characteristic shown in FIG. 25 may be translated into numerical expressions and data relative to the values of factors may be stored in the memory 326.

Although the sixth embodiment has been explained with reference to the video camera, the present invention can be applied to devices of other kinds using batteries.

As described above, according to the sixth embodiment, since the remaining amount of battery power of a battery is obtained from the open-circuit voltage thereof, it is possible to detect and display the remaining amount of battery power extremely accurately. Since the open-circuit voltage is calculated on the basis of a change of a load circuit at the time of a change from one operating mode of the system to another, a special operation for obtaining the open-circuit voltage is not needed.

A seventh embodiment of the present invention will be described below with reference to FIGS. 29 to 33.

Figure 29:
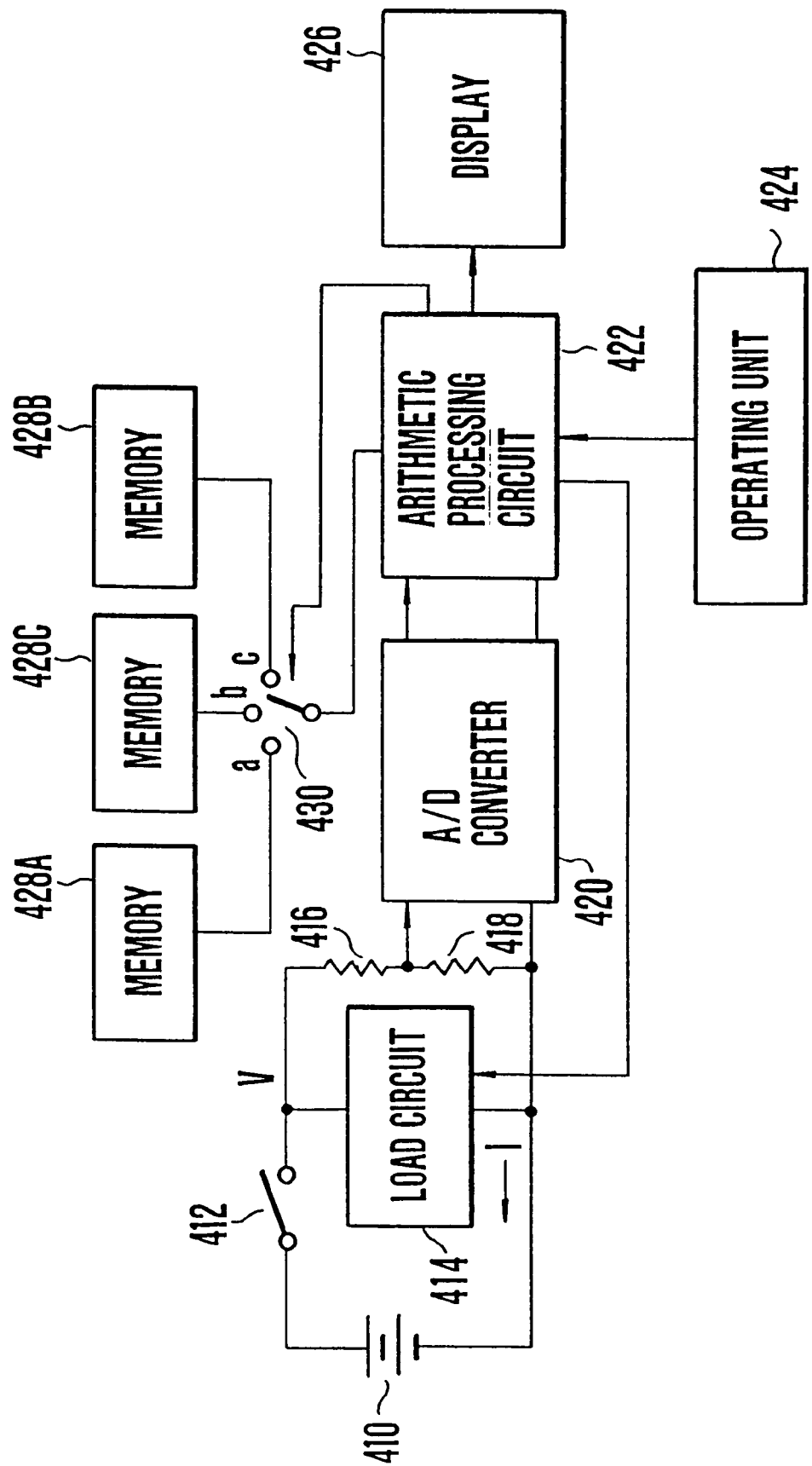
FIG. 29 is a block diagram showing an example of an arrangement in which a seventh embodiment of the present invention is applied to a video camera.

FIG. 29 is a block diagram showing an example of an arrangement in which the seventh embodiment of the present invention is applied to a video camera. The example shown in FIG. 29 includes a battery 410 for use as a power source, a power switch 412, a load circuit 414 for performing the main operations of the video camera, resistors 416 and 418, an A/D converter 420 for digitizing the terminal voltage of the resistor 418, an arithmetic processing circuit 422 for performing system control of the video camera and for performing arithmetic operations on the remaining amount of battery power of the battery 410, an operating unit 424 for instructing the video camera to perform various operations, a display 426 for displaying the obtained remaining amount of battery power, and memories 428A, 428B and 428C which store data relative to the discharge characteristics of various batteries which may be used. The memory 428A stores data relative to the discharge characteristic of a dry battery A, the memory 428B stores data relative to the discharge characteristic of a storage battery B, and the memory 428C stores data relative to the discharge characteristic of a battery C. Reference numeral 430 denotes a switch for selecting the memory 428A, 428B or 428C.

The seventh embodiment is arranged in such a manner that the open-circuit voltage v of the battery 410 is measured by utilizing variations of a load resistance which are based on the difference between the operating modes of the load circuit 414 and the kind of battery as determined from variations of the open-circuit voltage (internal electromotive voltage) v. The remaining amount of battery power is detected from a discharge characteristic corresponding to the kind of battery and is displayed. As in the case of the sixth embodiment shown in FIG. 24, if R represents the internal resistance of the battery 410, v the open-circuit voltage, I1 a load current corresponding to a load resistance r1, V1 a load terminal voltage corresponding to the same, I2 a load current corresponding to a load resistance r2, and V2 a load terminal voltage corresponding to the same, the above-described equations (1) are obtained.

In practice, the above-described voltages V1 and V2 are measured on the basis of the interterminal voltage of the resistor 418. Also, since the load resistance r corresponding to each operating mode is known, the currents I1 and I2 relative to the respective voltages V1 and V2 can be obtained in advance. Then, the open-circuit voltage v is obtained from the thus-obtained parameters V1, V2, I1 and I2 by the equations (1). The open-circuit voltage v is obtained twice at a predetermined time interval and the kind of battery used is identified on the basis of the difference Δv (=V1−V2) between the results of the two measurements. The remaining amount of battery power is thus obtained from a discharge characteristic corresponding to the aforesaid kind of battery.

The method of determining the remaining amount of battery power is, for example, to translate the discharge characteristics of various batteries into arithmetic expressions, identify the kind of battery, substitute the open-circuit voltage v into the arithmetic expressions, and obtain the remaining amount of battery power. Another method is to obtain the discharge characteristic of a predetermined representative battery, obtain correction values for various other batteries, and correct the discharge characteristic of the predetermined representative battery in accordance with the correction values. Yet another method is to store data relative to a discharge characteristic for each kind of battery in a memory, read, from the memory, data relative to a discharge characteristic corresponding to the kind of battery used, and determine the remaining amount of battery power on the basis of an open-circuit voltage measured with the read data. In the seventh embodiment, it is assumed that the last method is used to obtain the remaining amount of battery power.

The arithmetic processing circuit 422 determines which of the data relative to the discharge characteristics stored in the memories 428A, 428B and 428C is analogous to the discharge characteristic of the battery 410 used, and reads data on the remaining service time of a battery, relative to a measured open-circuit voltage, from a memory which stores data relative to the most analogous discharge characteristic. Thus, the serviceable time of the battery 410 is displayed on the display 426.

Figure 30:
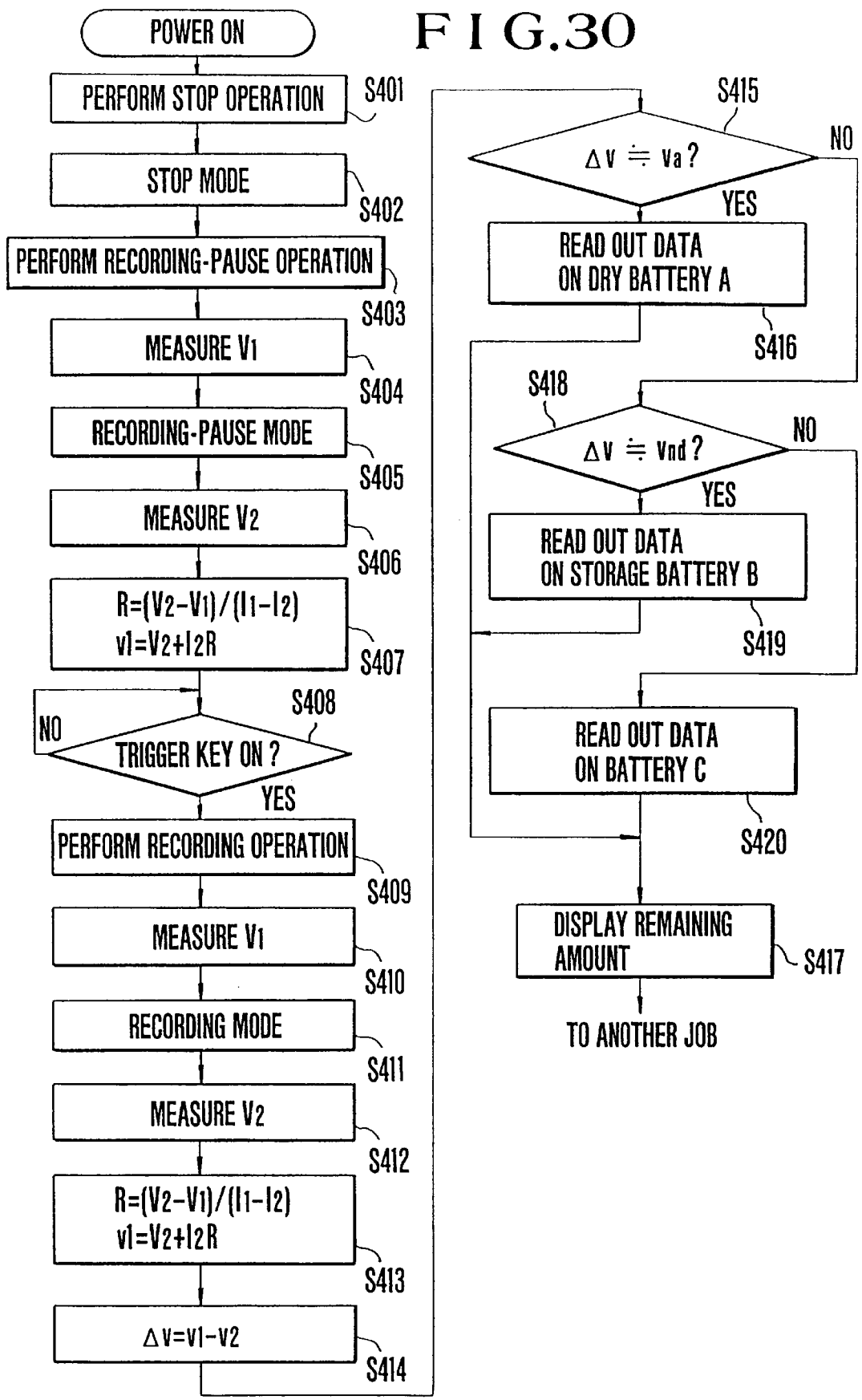
FIG. 30 is an operational flow chart showing the operation of the device shown in FIG. 29.

FIG. 30 shows an operational flow chart of the device shown in FIG. 29. The operation of the device shown in FIG. 29 will be described below with reference to the operational flow chart shown in FIG. 30. When the device is energized by switching on the power switch 412, the video camera is instructed to perform a stop operation (Step S401 of FIG.

30) and is set to a stop mode (Step S402 of FIG. 30). Subsequently, when the video camera is instructed to perform a recording-pause operation (Step S403 of FIG. 30), the operating mode is shifted from the stop mode to the recording-pause mode. Accordingly, the load terminal voltage V1 in the stop mode is measured (Step S404 of FIG. 30). Since a load in the stop mode is known, I2 can be obtained in advance. Then, the device is set to a recording-pause mode (Step S405 of FIG. 30), and the video camera is set to a recording-pause state. Subsequently, the load terminal voltage V2 provided at this time is measured (Step S406 of FIG. 30). Incidentally, I2 represents a load current provided in the recording-pause mode, and can be obtained in a manner similar to that used in calculating I1. The obtained four parameters V1, V2, I1 and I2 are applied to the equations (1) to calculate the open-circuit voltage v1 (Step S407 of FIG. 30).

Then, if the video camera is switched on by pressing a trigger button (not shown) of the video camera (Step S408 of FIG. 30), the device is instructed to perform a recording operation (Step S409 of FIG. 30), and the load terminal voltage V1 provided in the recording-pause mode before the recording mode is selected is measured. A load current provided at this time is equal to the load current I2 in the recording-pause mode obtained in Step S406, and this load current is set to I1. Thereafter, the recording mode is selected (Step S411 of FIG. 30) and the load terminal voltage V2 in the recording mode is measured (Step S412 of FIG. 30). The load current I2 provided at this time represents a load current provided in the recording mode. The open-circuit voltage V2 is obtained from the thus-obtained four parameters V1, V2, I1 and I2 (Step S413 of FIG. 30).

Then, the difference voltage Δv between the open-circuit voltages v1 and v2 obtained in Steps S407 and S413 of FIG. 30, is obtained (Step S414 of FIG. 30). Table 4 shows the correspondence between the open-circuit voltage v and the difference voltage Δv in each kind of battery. The difference voltages Δv$_a$, Δv$_{nd}$ and Δv$_c$ of the respective kinds of batteries, obtained from Table 4, are compared with the difference voltage Δv obtained in Step S414 of FIG. 30 (Steps S415, S418 and S420). If the difference voltages Δv$_a$, Δv$_{nd}$ or Δv$_c$ coincide with the difference voltage Δv within the range of allowable errors, it is determined that a battery of the kind corresponding to the difference voltage is used. Data on the remaining service time of a corresponding kind of battery is read out of data relative to a discharge characteristic indicative of the relation between the open-circuit voltage and the remaining amount of battery power which corresponds to each kind of battery, which data is stored in a respective one of the memories 428A, 428B and 428C of FIG. 29 (Step S416, S419 and S420 of FIG. 30). The data thus read is displayed on the display 426 (Step S417 of FIG. 30).

Figure 31:
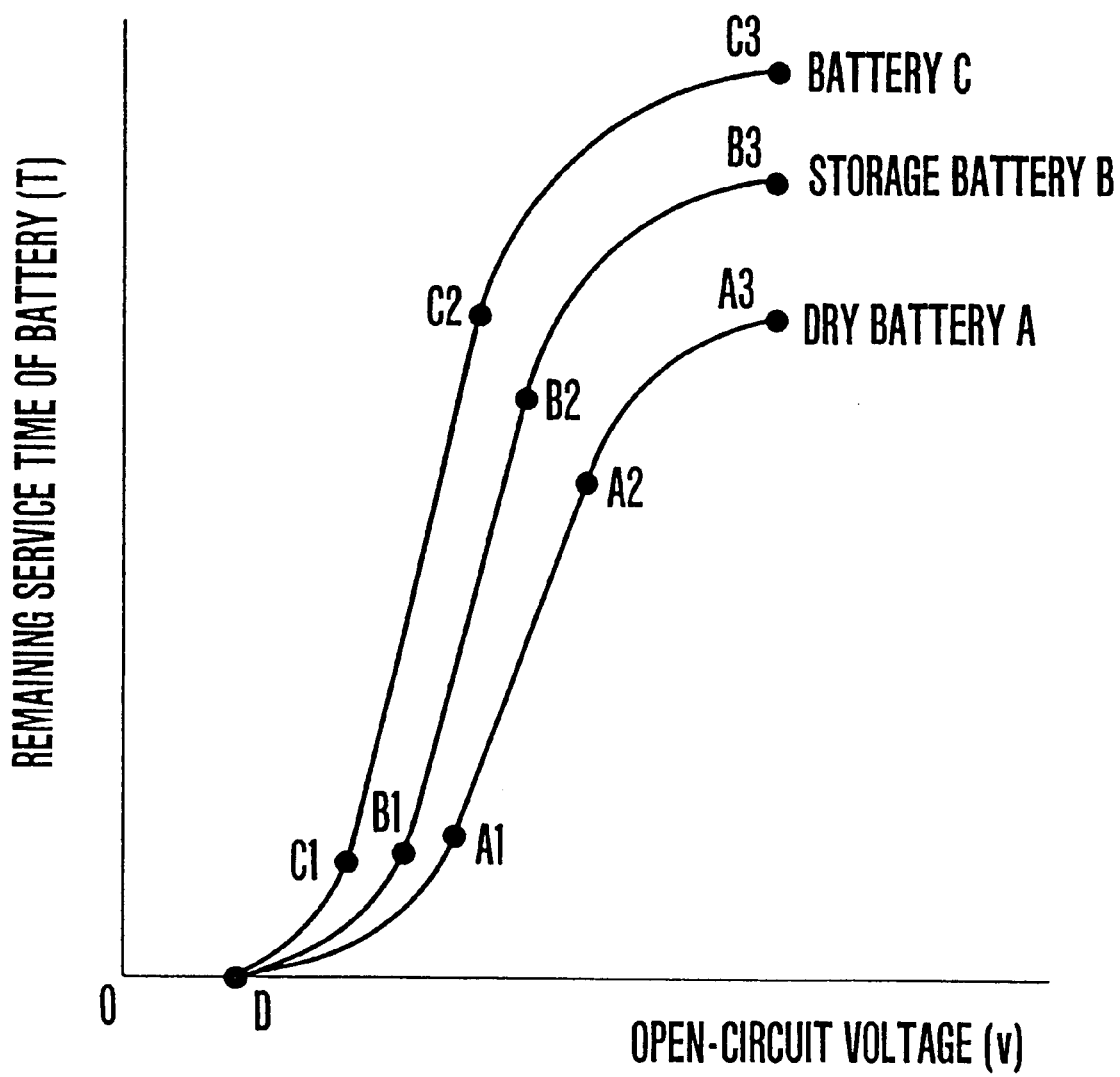
FIG. 31 is a graphic representation showing the relation between an open-circuit voltage and the remaining service time of a battery.

For example, if the difference voltage obtained in Step S414 of FIG. 30 is Δv$_{nd1}$, the process proceeds from Step S415 to Step S419 through Step S418. In Step S419, it is determined from Table 5 that the remaining service time of the battery is nd1 minutes. Incidentally, the data shown in Table 5 are obtained in advance and stored in the corresponding memories 428A, 428B and 428C. FIG. 31 is a graphic representation showing the relation between an open-circuit voltage and the remaining service time of a battery. In FIG. 31, the horizontal axis represents the open-circuit voltage v, while the vertical axis represents the remaining service time T.

The timing of measurement of the open-circuit voltage V1 when the operating mode is changed is in the order: the stop mode, the recording-pause mode and the recording mode; and is similar to the timing shown in the timing chart of FIG. 26 which has been described in connection with the sixth embodiment.

TABLE 4

| OPEN-CIRCUIT VOLTAGE | KIND OF BATTERY | | |
|---|---|---|---|
| | DRY BATTERY A | STORAGE BATTERY B | BATTERY C |
| V1 | ΔVa1 | ΔVnd1 | ΔVc1 |
| V2 | ΔVa2 | ΔVnd2 | ΔVc2 |
| V3 | ΔVa3 | ΔVnd3 | ΔVc3 |
| ... | ... | ... | ... |
| Vn | ΔVan | ΔVndn | ΔVcn |

TABLE 5

| OPEN-CIRCUIT VOLTAGE | KIND OF BATTERY | | |
|---|---|---|---|
| | DRY BATTERY A | STORAGE BATTERY B | BATTERY C |
| V1 | a1 min | nd1 min | C1 min |
| V2 | a2 min | nd2 min | C2 min |
| V3 | a3 min | nd3 min | C3 min |
| ... | ... | ... | ... |
| Vn | an min | ndn min | Cn min |

As another modification of the seventh embodiment, reference will be made to a method of substituting arithmetic expressions for the discharge characteristic of each kind of battery and obtaining the remaining service time of a battery from the kind of battery and the open-circuit voltage v by using the arithmetic expressions. In this method, first of all, the discharge characteristic curve of each kind of battery is divided into several intervals, and an approximate linear, cubic or quadratic expression is applied to each of the intervals. In this modification, as shown in FIG. 31, the discharge characteristic curve of each kind of battery is divided into three intervals. That is to say, the discharge characteristic curve of the battery A is divided into the intervals D to A1, A1 to A2, and A2 to A3; the discharge characteristic curve of the battery B is divided into the intervals D to B1, B1 to B2, and B2 to B3; and the discharge characteristic curve of the battery C is divided into the intervals D to C1, C1 to C2, and C2 to C3. Regarding the battery A, the intervals D to A1, A1 to A2 and A2 to A3 are respectively approximated by quadratic curves represented by $T_a = a1v^2 + a2v + a3$, $T_a = a4v + a5$ and $T_a = a6v^2 + a7v + a8$. Regarding the battery B, the intervals D to B1, B1 to B2 and B2 to B3 are respectively approximated by quadratic curves represented by $T_b = b1v^2 + b2v + b3$, $T_b = b4v + b5$ and $T_b = b6v^2 + b7v + b8$. Regarding the battery C, the intervals D to C1, C1 to C2 and C2 to C3 are respectively approximated by quadratic curves represented cy $T_c = c1v^2 + c2v + c3$, $T_c = c4v + c5$ and $T_c = c6v^2 + c7v + c8$. Although, in the above-described modification, the discharge characteristic curve of each kind of battery is divided into three intervals which are approximated by respective quadratic curves, the discharge characteristic curve may be divided into smaller intervals, each of which can be approximated by a cubic curve. With this method, it is possible to represent discharge characteristics as more accurate numerical expressions.

The kind of battery can be identified by comparing measured open-circuit voltages v and their difference voltages Δv with the data in Table 4, as in the case of the embodiment described above.

Figure 32:
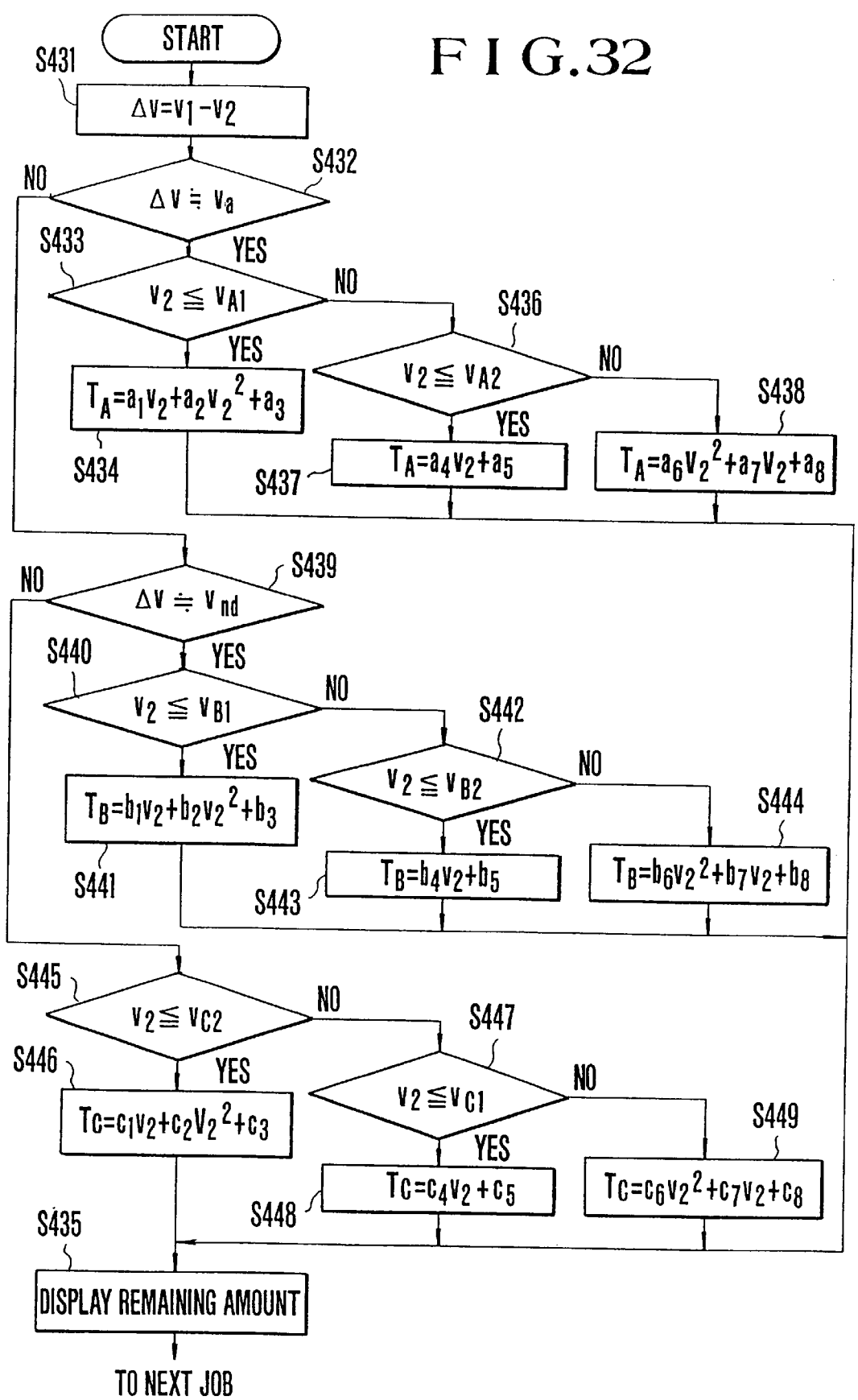
FIG. 32 is a flow chart showing the operation of one modification of the seventh embodiment of the present invention.

FIG. 32 is a flow chart showing the operation of the above-described modification of the seventh embodiment of the present invention. For the sake of simplicity, FIG. 32 shows only steps which replace Steps S415 to S420 in FIG. 30. Referring to FIG. 32, first of all, the difference voltage Δv of the open-circuit voltage v is calculated (Step S431 of FIG. 32), and the data Δva, Δvnd and Δvc are read from the memories 428A, 428B and 428C, which store the data shown in a correspondence table (Table 4) which shows the relation between the open-circuit voltage v and the difference voltage Δv of each kind of battery. Each of the data Δva, Δvnd and Δvc is compared with the calculated data Δv (Step S432 of FIG. 32). If the difference voltage Δv coincides with, for example, the difference voltage Δva within the range of allowable errors (Step S432 of FIG. 32), an approximate expression corresponding to an interval to which the open-circuit voltage V2 belongs is selected from the above noted expressions to calculate a remaining service time Ta (Steps S433, S434, S436, S437 and S438 of FIG. 32). In Steps S433 and S436, Va1 and Va2 represent open-circuit voltages at the points A1 and A2, respectively.

If the difference voltage Δv of the open-circuit voltage does not coincide with the difference voltage Δva within the range of allowable ranges (Step S432 of FIG. 32), it is determined whether the difference voltage Δv coincides with the difference voltage Δvnd within the range of allowable errors (Step S439 of FIG. 32). If they coincide with each other, an approximate expression corresponding to an interval to which the open-circuit voltage V2 belongs is selected from the above noted expressions to calculate a remaining service time Tb (Steps S440, S441, S442, S443 and S444 of FIG. 32). In Steps S440 and S442, Vb1 and Vb2 represent open-circuit voltages at the points B1 and B2, respectively.

If the difference voltage Δv of the open-circuit voltage does not coincide with the difference voltage Δvnd within the range of allowable errors (Step S439 of FIG. 32), it is determined that the battery C is in use, and an approximate expression corresponding to an interval to which the open-circuit voltage V2 belongs is selected from the above noted expressions to calculate a remaining service time Tc (Steps S445, S446, S447, S448 and S449 of FIG. 32). In Steps S445 and S447, Vc1 and Vc2 represent open-circuit voltages at the points C1 and C2, respectively.

The remaining service times Ta, Tb and Tc thus obtained are displayed on the display 426 (Step S435 of FIG. 32).

Figure 33:
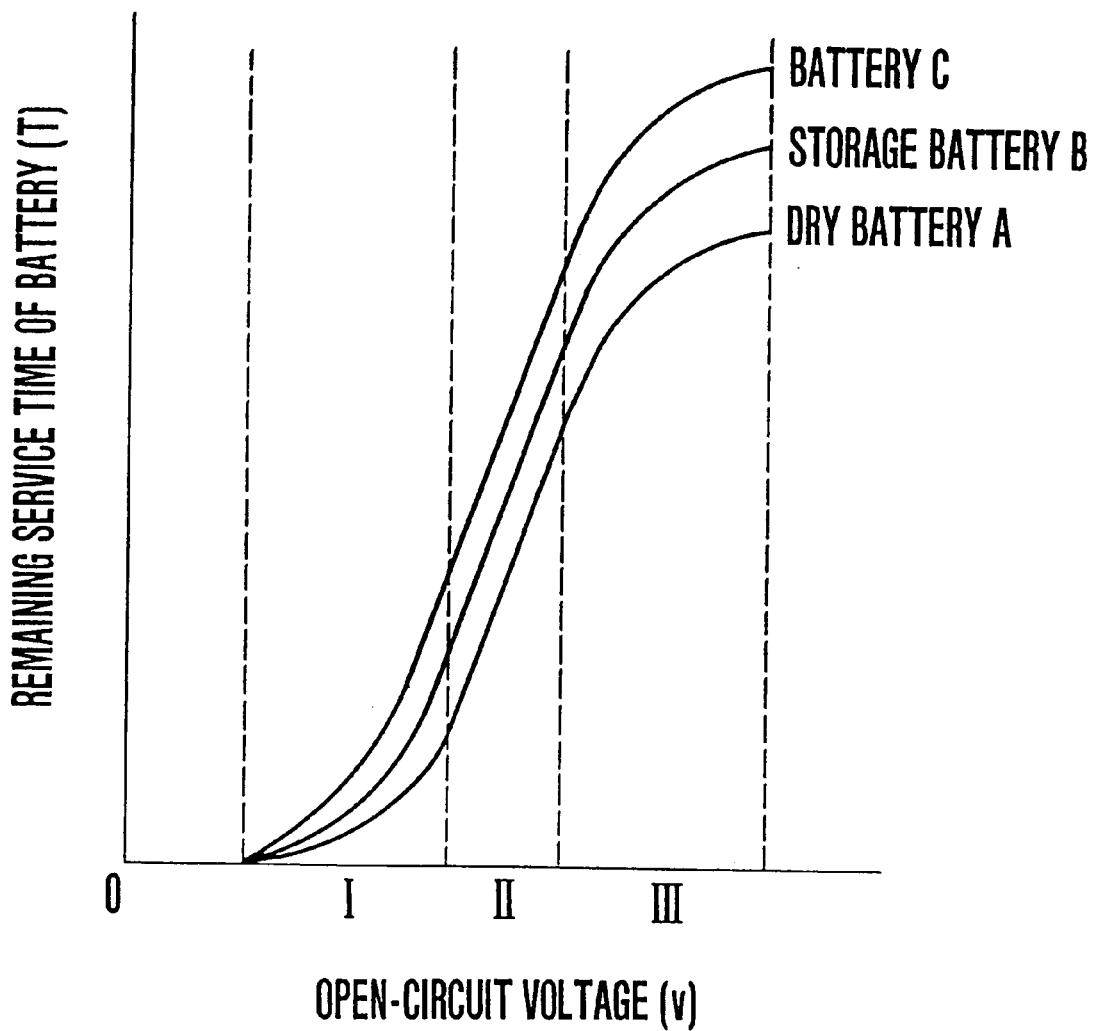
FIG. 33 is a graph showing the relation between an open-circuit voltage and a remaining service time.

As yet another modification of the seventh embodiment, reference will be made to another method for obtaining the remaining service time of a battery by using a method including the steps of selecting an arbitrary representative battery as a reference battery to obtain the discharge characteristic of the reference battery in advance, determining different correction values for correcting the discharge characteristics of other individual kinds of batteries with respect to the discharge characteristic of the reference value, and correcting a reference characteristic on the basis of a correction value selected from among the correction values. FIG. 33 is a graph showing the relation between an open-circuit voltage (v) and a remaining service time (T). In FIG. 33, the open-circuit voltage (v) is divided into three regions I, II and III, the region I is approximated by curves, the region II by straight lines, and the region III by curves. The battery B is selected as a reference battery and, as shown in Table 6 by way of example, correction factors for the discharge characteristics of the batteries A and C are determined for each region. For example, the discharge characteristic of the battery A is corrected in the following manner: In the region I, the discharge characteristic of the reference battery B is multiplied by 0.85; in the region II, 0.1 is subtracted from this discharge characteristic; and, in the region III, the discharge characteristic is multiplied by 0.9. The discharge characteristic of the battery C is corrected in the following manner: In the region I, the discharge characteristic of the reference battery B is multiplied by 1.1; in the region II, 0.1 is added to this discharge characteristic; and, in the region III, the discharge characteristic is multiplied by 1.2. The other processes are similar to those performed in the above-described modification. The method described above is particularly useful if each battery used has an approximate discharge characteristic curve.

TABLE 6

| REGION | BATTERY A | BATTERY B | BATTERY C |
|--------|-----------|-----------|-----------|
| I      | ×0.85     | ×1        | ×1.1      |
| II     | −0.1      | 0         | +0.1      |
| III    | ×0.9      | ×1        | ×1.2      |

As described above, according to the seventh embodiment, the extent of consumption of a battery is actually measured and the remaining amount of battery power is obtained on the basis of the discharge characteristic of the battery, whereby it is possible to accurately detect and display the remaining amount of battery power. In addition, if different kinds of batteries are used, the accurate remaining amount of battery power can be obtained.

An eighth embodiment of the present invention will be described below with reference to FIGS. 34 to 38.

Figure 34:
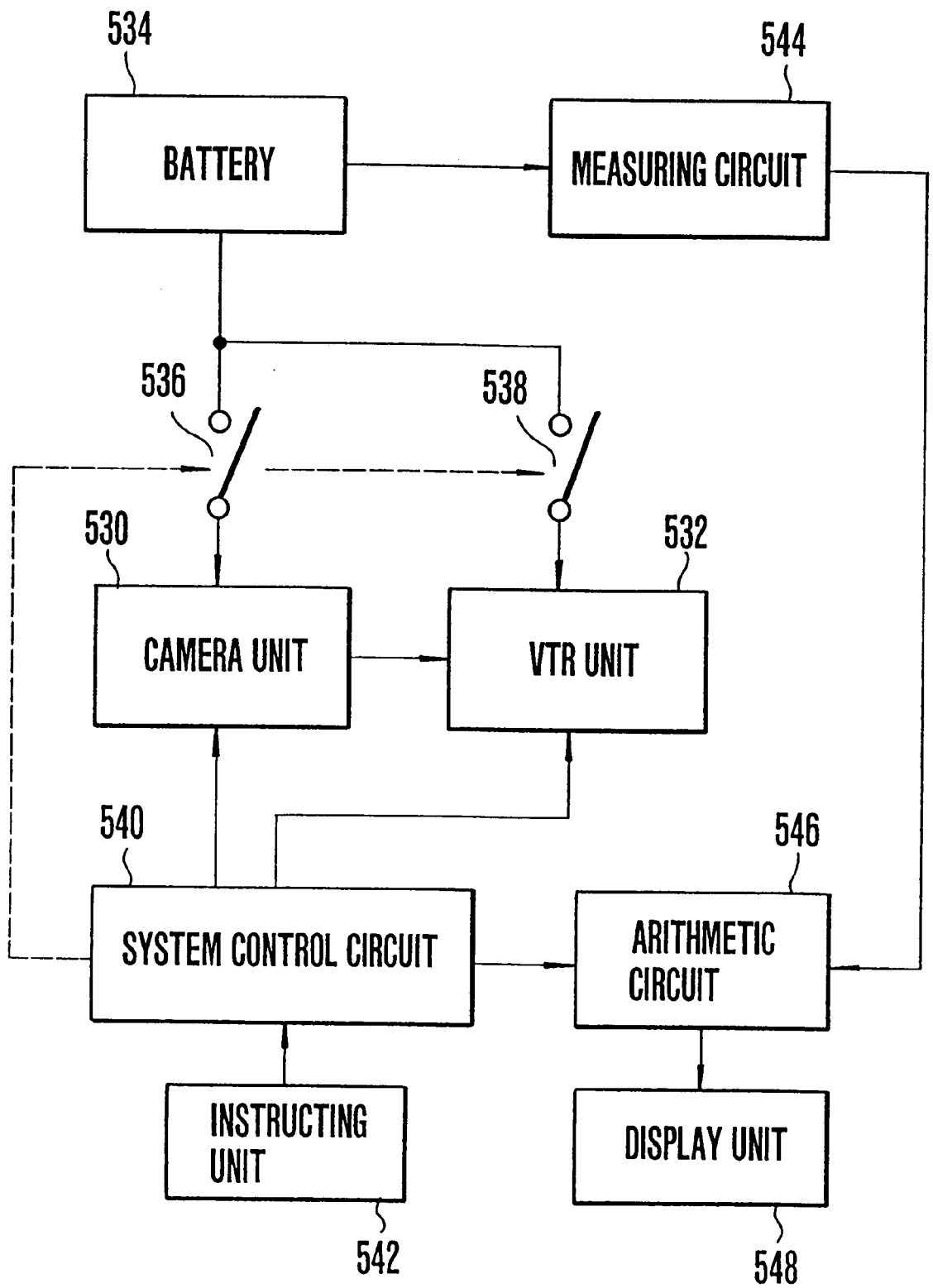
FIG. 34 is a block diagram showing an arrangement in which an eighth embodiment of the present invention is applied to a video camera.

FIG. 34 is a block diagram showing an arrangement in which the eighth embodiment of the present invention is applied to a video camera. The arrangement shown in FIG. 34 includes a camera unit 350, a VTR unit 532, a battery 534 for supplying electrical power to the camera unit 530 and the VTR unit 532 through switches 536 and 538, respectively, a system control circuit 540 for controlling the operations of the camera unit 530 and the VTR unit 532 and the closure and opening of the switches 536 and 538, an instructing unit 542 operated to input an instruction indicative of a predetermined operation into the system control circuit 540, a measuring circuit 544 for measuring the output voltage of the battery 534, an arithmetic circuit 546 for calculating the remaining amount of battery power of the battery 534 from the output of the measuring circuit 544 and an operation signal from the system control circuit 540, and a display unit 548 for displaying the remaining amount of battery power calculated by the arithmetic circuit 546.

Figure 35:
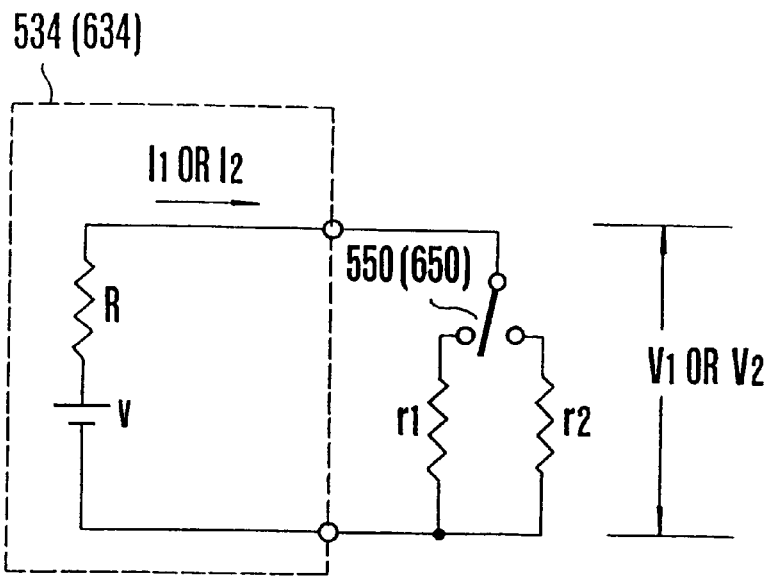
FIG. 35 is a schematic diagram which serves to illustrate the operational principle of the eighth embodiment.

In the eighth embodiment, two kinds of loads are selectively connected to the battery 534 whose remaining amount of battery power is to be measured, then an internal electromotive voltage (open-circuit voltage) v is measured for each kind of load, and then the measured internal electromotive voltage v is compared with a characteristic curve indicative of the relation between previously obtained internal electromotive voltages and the remaining amount of battery power, whereby the remaining amount of battery power of the battery 534 is estimated. More specifically, as shown in FIG. 35, the relation between the internal resistance R, the internal electromotive voltage v, the output voltage V and the output current I of the battery 534 is measured for each operating state of the device. In FIG. 35, load resistors r1 and r2 are provided for measuring purposes and are selected by a switch 550. The load resistor r1 is selected in, for example, a recording mode, while the load resistor r2 is selected in, for example, another operating mode. If I1 represents a current obtainable when the switch 550 is connected to the load resistor r1, V1 represents a voltage drop across the load resistor r1, I2 represents a current obtainable when the switch 550 is connected to the load resistor r2, and V2 represents a voltage drop across the load resistor r2, the following equation is obtained:

$$R = (V2-V1)/(I1-I2) \qquad \ldots (2)$$

If V represents the output voltage of the battery 534 and I represents the output current of the same, the following equation is obtained:

$$v = V + I \cdot R \qquad \ldots (3)$$

Therefore, $$v = V + I(V2-V1)/(I1-I2) \qquad \ldots (4)$$

The internal electromotive voltage v, which is not greatly influenced by the internal resistance R, is relatively insensitive to variations of load resistance and also varies with variations of the remaining amount of battery power. For this reason, if a relation curve indicative of the relation between the internal electromotive voltage v and the remaining amount of battery power is prepared in advance and the aforesaid I1, I2, V1, V2, V and I are measured, the calculated internal electromotive voltage v can be compared with the relation curve to estimate the remaining amount of battery power available at that time. The operation of the eighth embodiment of the device according to the present invention will be described below with specific reference to an example in which a video camera is continuously used in a recording mode and in which the remaining amount of battery power is displayed as a value T which is obtained by converting the remaining amount into serviceable time.

Figure 36:
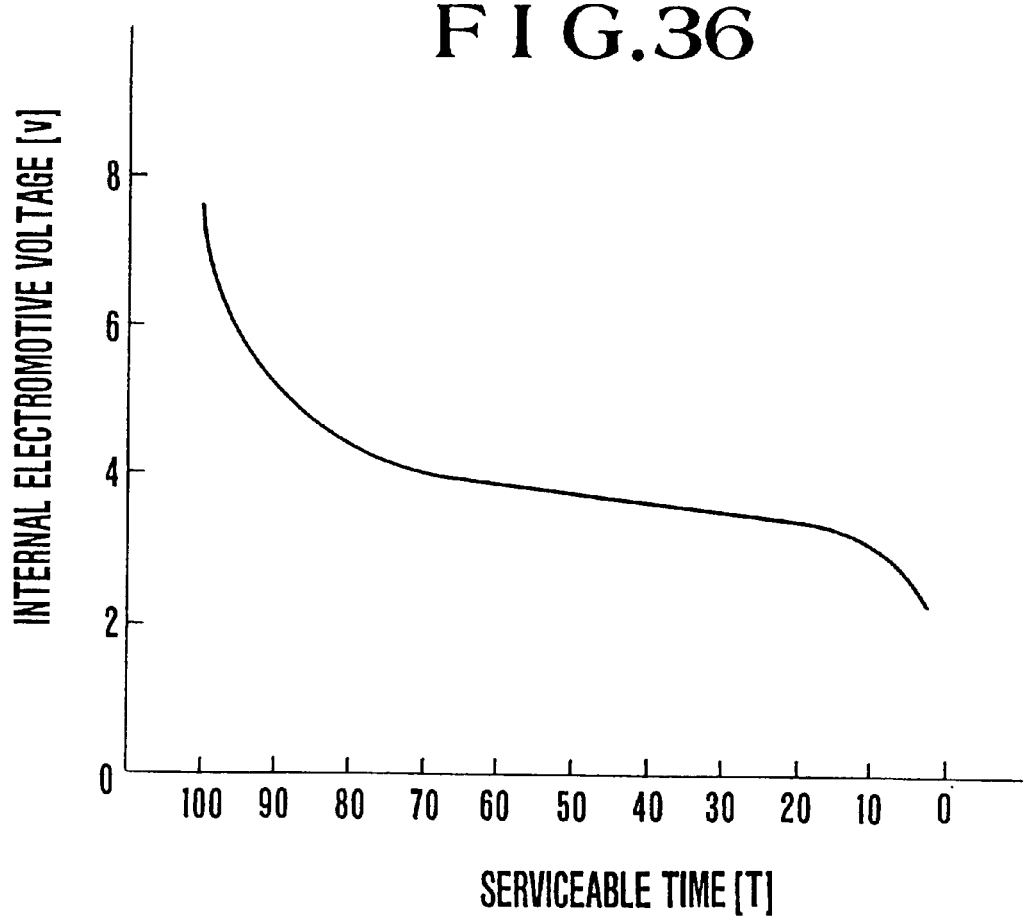
FIG. 36 is a graphic representation showing a characteristic curve obtained when a Ni-Cd secondary battery is used.

Initially, in the video camera, a characteristic curve is obtained by measurement, which indicates the relation between the internal electromotive voltage v and the serviceable time T of the battery (the remaining amount of battery power). In this case, to improve the accuracy of the characteristic curve, measured values obtained from batteries of the same type which may be used with the video camera are averaged to provide the aforesaid characteristic curve. FIG. 36 is a graph showing a characteristic curve obtained when an Ni-Cd secondary battery is used, and data on the characteristic curve shown in FIG. 36 is stored in a memory of the arithmetic circuit 546 of FIG. 34.

If a serviceable time relative to another operating mode is to be estimated, the serviceable time T of the battery may be multiplied by a factor k corresponding to the amount of current consumed in the desired operating mode.

Figure 37:
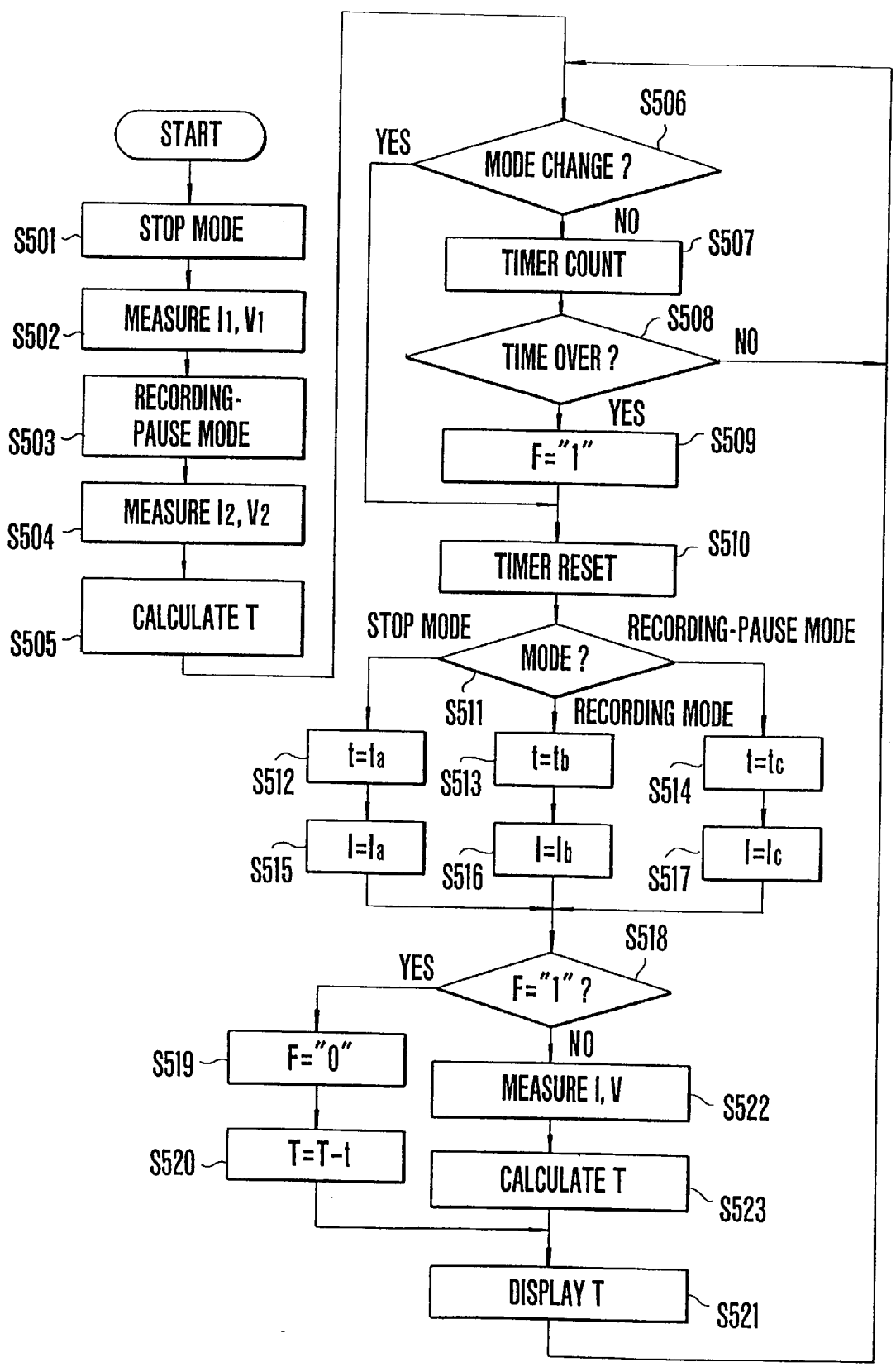
FIG. 37 is an operational flow chart showing a procedure for displaying the remaining amount of battery power in the device shown in FIG. 34.

A procedure for displaying the remaining amount of battery power by the device shown in FIG. 34 will be described below with reference to the operational flow chart shown in FIG. 37 and the timing chart shown in FIG. 38. Referring to FIG. 37, when the device is started by energizing it an operating mode (M) is set to a stop mode (Step S501). Then, the output voltage V1 of the battery 534 is measured by the measuring circuit 544 and the output current I1 corresponding to the stop mode is calculated by the arithmetic circuit 546 (Step S502). Then, the operating mode is set to a recording-pause mode (Step S503), and the output voltage V2 of the battery 534 is measured by the measuring circuit 544 and the current value I2 corresponding to the recording mode is calculated by the arithmetic circuit 546 (Step S504). Subsequently, the internal electromotive voltage v is obtained by the above noted equation (4), and the serviceable time T is obtained from data on the characteristic curve stored in the memory of the arithmetic circuit 546 (Step S505).

It is determined whether the operating mode has been changed (Step S506). If the operating mode has been changed, a timer in the system control circuit 540 is reset (Step S510). If the operating mode has not been changed, the timer starts counting (S507) and Steps S506 to S508 are repeated until a predetermined time is elapsed (Step S508). When the predetermined time is elapsed, a flag F is set to "1" and the timer is reset (Step S510). The flag F indicates whether accumulation processing or recalculation processing should be performed. If the same processing continues for a predetermined time, the flag F is set to "1" and the process proceeds to the operation of arithmetic processing for accumulation. If the operating mode is not changed, the flag F remains "0" and the process proceeds to the operation of arithmetic processing for recalculation.

After the timer is reset (Step S510), the operating mode is identified (Step S511) and the value of the consumed power of the battery is converted into the value of the remaining amount of battery power, which value corresponds to the stop mode, the recording mode or the recording-pause mode, and the resultant value is stored as a variable t (Step S512, S513 or S514). A current value Ia, Ib or Ic corresponding to the selected operating mode is stored as a variable I (Step S515, S516 or S517). Then, the process branches in accordance with the flag F (Step S518). If F="1" (the operation of arithmetic processing for accumulation), the flag F is reset to "0" (Step S519) and the consumed amount t is subtracted from the current remaining-amount value T (Step S520) to display the latest remaining-amount value T (Step S521). If F="0" (the operation of arithmetic processing for recalculation) (Step S518), the output voltage V after the change of the operating mode is measured (Step S522) to calculate the latest remaining-amount value T (Step S523). In Step S523, I1 and V1 to be substituted into the above noted equation (4) are replaced with I2 and V2. Subsequently, the subscripts "1" and "2" are changed in a similar manner each time the step of calculating T is performed. After Step S523, the calculated remaining-amount value T is displayed (Step S521).

After Step 521 has been performed, the process returns to Step S506 and the steps following Step S506 are repeated.

If a change from one operating mode to another has occurred (Step S506), the timer is forcibly reset (Step S507), whereby a recalculated value is selected as a remaining-amount value to be displayed with priority.

Figure 38:
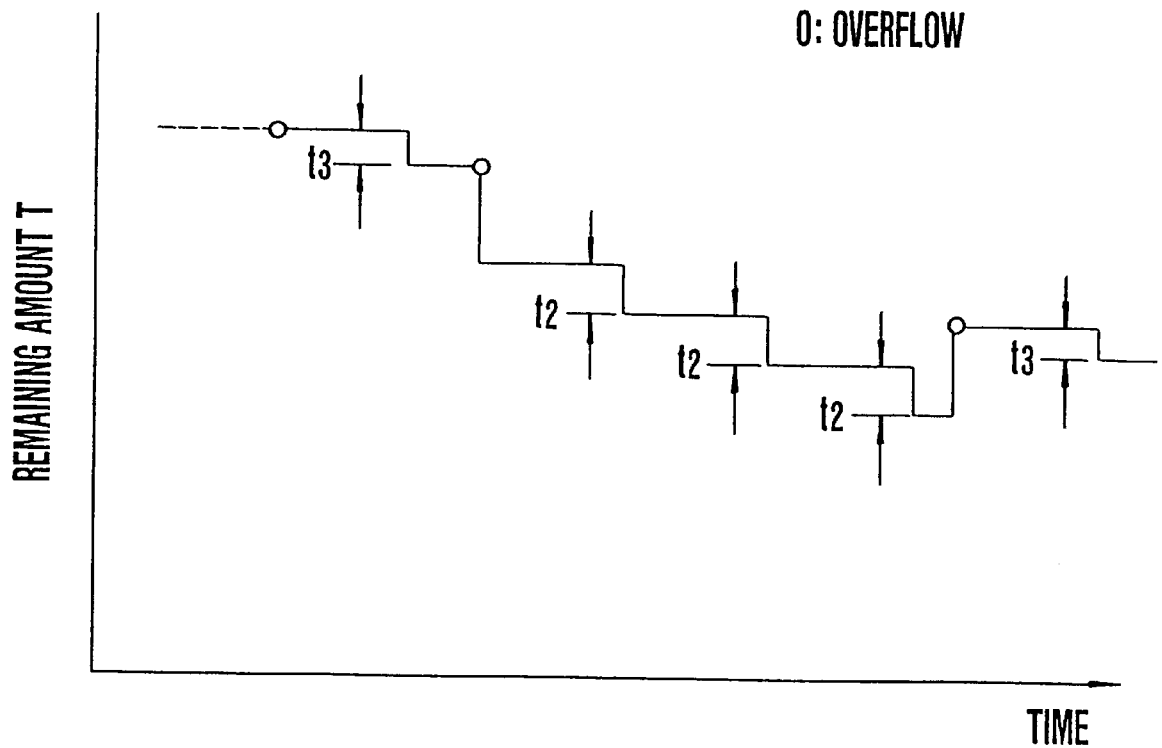
FIG. 38 is a timing chart showing the procedure for displaying the remaining amount of battery power in the device shown in FIG. 34.

FIG. 38 shows shifts in operating mode when the device is in operation, associated changes in a timer•counter and those of a displayed remaining-amount value. In FIG. 38, the upper part indicates mode shift, the middle part indicates the timings of resetting and overflow of the timer•counter, and the lower graph shows variations of the remaining-amount value T with time. A step t2 in the remaining-amount value T indicates a representative subtrahend during recording, while a step t3 indicates a representative subtrahend during a recording-pause. It can be seen from the graph that subtractions are performed in the interval of the same mode with the passage of time.

As described above, according to the eighth embodiment, it is possible to estimate the remaining-amount value of battery power highly accurately even while the operating modes are being switched. It is also possible to correctly estimate the remaining-amount value of battery power even if the video camera is continuously used without switching the operating mode.

A ninth embodiment of the present invention will be described below with reference to FIGS. 39 to 42.

FIG. 39 is a block diagram showing an arrangement in which the ninth embodiment of the present invention is applied to a video camera. The arrangement shown in FIG. 39 includes a camera unit 630, a VTR unit 632, a battery 634 serving as a power source for the camera unit 630 and the VTR unit 632, an AC adapter 635 for converting AC power into DC power, and a selecting switch 636 for selecting the battery 634 or the AC adapter 635. The DC voltage selected by the selecting switch 636 is applied to the power input terminal of the camera unit 630 through a switch 637 or to the power input terminal of the VTR unit 632 through a switch 638. The shown arrangement also includes a system control circuit 640 for controlling the operations of the camera unit 630 and the VTR unit 632 and the closure and opening of the switches 637 and 638, an instructing unit 642 operated to input an instruction indicative of a predetermined operation into the system control circuit 640, a measuring circuit 644 for measuring the DC voltage selected by the switch 636, an arithmetic circuit 646 for calculating the remaining amount of battery power of the battery 634 from the output of the measuring circuit 644 and an operation signal from the system control circuit 640, a display unit 648 for displaying the remaining amount of battery power calculated by the arithmetic circuit 646, and an identifying circuit 649 for determining whether the battery 634 or the AC adapter 635 is in use. As shown, in the ninth embodiment, this determination is made on the basis of the output of the measuring circuit 644.

Figure 40A:
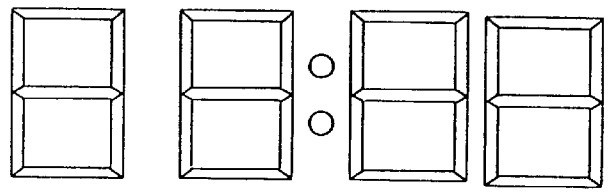
FIGS. 40(a), 40(b) and 40(c) are schematic views showing the manner of display provided by a display unit utilizing seven-segment display elements.
Figure 40B:
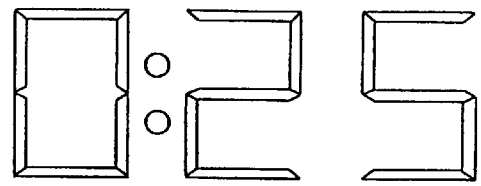
Figure 40C:
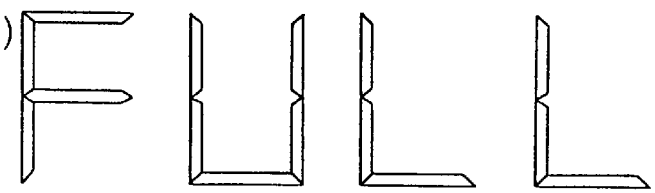

FIGS. 40(a), 40(b) and 40(c) show the manner of display provided by the display unit 648 utilizing seven-segment display elements.

In the ninth embodiment, two kinds of loads are selectively connected to the battery 634 whose remaining amount of battery power is to be measured, then an internal electromotive voltage (open-circuit voltage) v is measured for each kind of load, and then the measured internal electromotive voltage v is compared with a characteristic curve indicative of the relation between previously obtained internal electromotive voltages and the remaining amount of battery power, whereby the remaining amount of battery power of the battery 634 is estimated. More specifically, the relation between the internal resistance R, the internal electromotive voltage v, the output voltage V and the output current I of the battery 634 is measured for each state of consumption by the circuit of the eighth embodiment shown in FIG. 35. In FIG. 35, load resistors r1 and r2 are provided for measuring purposes and are selected by a switch 650. The load resistor r1 is selected in, for example, a recording mode, while the load resistor r2 is selected in, for example, another operating mode. If I1 represents a current obtainable when the switch 650 is connected to the load resistor r1, V1 represents a voltage drop across the load resistor r1, I2 represents a current obtainable when the switch 650 is connected to the load resistor r2, and V2 represents a voltage drop across the load resistor r2, an equation identical to Equation (2) of the eighth embodiment is obtained. If V represents the output voltage of the battery 634 and I represents the output current of the same, an equation similar to Equation (3) of the eighth embodiment is obtained. Therefore, an equation similar to Equation (4) of the eighth embodiment is obtained.

The internal electromotive voltage v, which is not greatly influenced by the internal resistance R, is relatively insensitive to variations of load resistance and also varies with variations of the remaining amount of battery power. For this reason, if a relation curve indicative of the relation between the internal electromotive voltage v and the remaining amount of battery power is prepared in advance and the aforesaid I1, I2, V1, V2, V and I are measured at appropriate timings during the operation of the device, the calculated internal electromotive voltage v can be compared with the relation curve to estimate the remaining amount of battery power available at that time. The operation of the ninth embodiment of the device according to the present invention will be described below with specific reference to an example in which a video camera is continuously used in a recording mode and in which the remaining amount of battery power is displayed as a value T which is obtained by converting the remaining amount into serviceable time.

Initially, in the video camera, a characteristic curve is obtained by measurement, which indicates the relation between the internal electromotive voltage v and the serviceable time T of the battery (the remaining amount of battery power). In this case, to improve the accuracy of the characteristic curve, measured values obtained from batteries of the same type which may be used with the video camera are averaged to provide the aforesaid characteristic curve. FIG. 41 is a graph showing a characteristic curve obtained when an Ni-Cd secondary battery is used, and data on the characteristic curve 660 shown in FIG. 41 is stored in a memory of the arithmetic circuit 646 of FIG. 39. In contrast, since the DC voltage output from an AC adapter does not decrease as time passes, a substantially linear characteristic 662 is obtained as shown by a dashed line in FIG. 41.

If a serviceable time relative to another operating mode is to be estimated, the serviceable time T of the battery may be multiplied by a factor k corresponding to the amount of current consumed in the operating mode.

Figure 42:
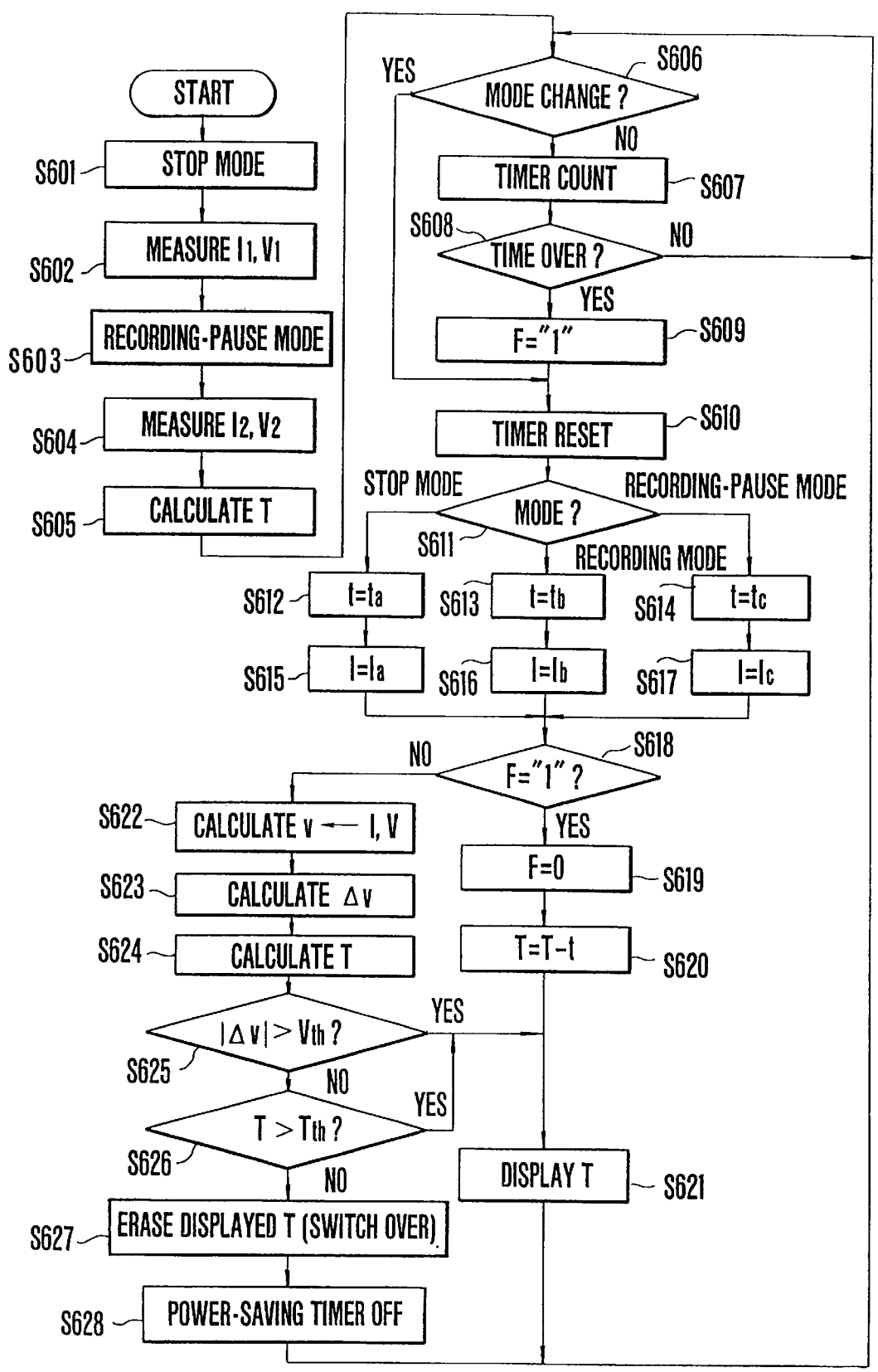
FIG. 42 is an operational flow chart showing a procedure for displaying the remaining amount of battery power in the device shown in FIG. 39.

A procedure for displaying the remaining amount of battery power by the device shown in FIG. 39 will be described below with reference to the operational flow chart shown in FIG. 42. Referring to FIG. 39, when the device is started by energizing it, an operating mode is set to a stop mode (Step S601). Then, the output voltage V1 of the battery 634 is measured by the measuring circuit 644 and the output current I1 corresponding to the stop mode is calculated by the arithmetic circuit 646 (Step S602). Then, the operating mode is set to a recording-pause mode (Step S603), and the output voltage V2 of the battery 634 is measured by the measuring circuit 644 and the current value I2 corresponding to the recording mode is calculated by the arithmetic circuit 646 (Step S604). Subsequently, the internal electromotive voltage v is obtained by the equation (4) of the eighth embodiment, and the serviceable time T is obtained from data on the characteristic curve stored in the memory of the arithmetic circuit 646 (Step S605).

It is determined whether the operating mode has been changed (Step S606). If the operating mode has been changed, a timer in the system control circuit 640 is reset (Step S610). If the operating mode has not been changed, the timer starts counting (S607) and Steps S606 to S608 are repeated until a predetermined time is elapsed (Step S608). When the predetermined time is elapsed, a flag F is set to "1" (Step S609) and the timer is reset (Step S610. The flag F indicates whether accumulation processing or recalculation processing should be performed. If the same processing continues for a predetermined time, the flag F is set to "1" and the process proceeds to the operation of arithmetic processing for accumulation. If the operating mode is not changed, the flag F remains "0" and the process proceeds to the operation of arithmetic processing for recalculation.

After the timer is reset (Step S610), the operating mode is identified (Step S611) and the value of the consumed power of the battery is converted into the value of the remaining amount of battery power which value corresponds to the stop mode, the recording mode or the recording-pause mode, and the resultant value is stored as a variable t (Step S612, S613 or S614). A current value Ia, Ib or Ic corresponding to the selected operating mode is set as a variable I (Step S615, S616 or S617). Then, the process branches in accordance with the flag F (Step S618). If F="1" (the operation of arithmetic processing for accumulation), the flag F is reset to "0" (Step S619) and the consumed amount t is subtracted from the current remaining-amount value T (Step S620) to display the latest remaining-amount value T (Step S621).

If F="0" (the operation of arithmetic processing for recalculation) (Step S618), the output voltage V after the change of the operating mode is measured to calculate the internal electromotive voltage v by using the current I set in Step S615, S616 or S617 (Step S622). The voltage difference Δv between the currently calculated internal electromotive voltage v and the previously calculated internal electromotive voltage v is calculated (Step S623). At this point in time, I1 and V1 to be substituted into the equation (4) of the eighth embodiment are replaced with I2 and V2. Subsequently, the subscripts "1" and "2" are changed in a similar manner each time the step of calculating T is performed. After Step S623, the latest remaining-amount value T is obtained (Step S624).

The absolute value of the difference voltage Δv obtained in Step S623 is compared with a predetermined threshold Vth (Step S625). If it is greater than the predetermined threshold Vth, this indicates that a decrease in capacity has occurred and it is determined, therefore, that the battery 634 is used as a power source. If the absolute value is not less than Vth, it is determined that the AC adapter 635 is connected and AC power is used as a power source. However, even if a battery is used as a power source, a relatively flat portion appears in the middle of the characteristic curve 660 as shown in FIG. 41. For this reason, to improve detection accuracy, it is determined that the AC adapter 635 is used if an estimated remaining-amount value T is not greater than a threshold Tth (Step S627).

If the battery 634 is in use, the estimated remaining-amount value T is displayed (Step S621). If the AC adapter 635 is in use, the display of the remaining amount is turned off, or a display indicating that the AC adapter is in use, for example, "FULL" as shown in FIG. 40(c), is selected (Step S627) and the operation of a power-saving timer for preventing consumption of the battery is set to an OFF state (Step S628).

After Step S621 or S628 has been performed, the process returns to Step S606 and the steps following Step S606 are repeated.

Although the ninth embodiment has been explained with reference to an AC adapter, it can, of course, be applied to a car-battery adapter for use in an automobile. Although the ninth embodiment is arranged in such a manner that the battery 634 or the AC adapter 635 is selected by the switch 636, it is also possible to adopt an arrangement in which an AC adapter is connected in parallel to a secondary battery so that electrical power is supplied from the adapter to the camera unit or the VTR unit 632 while the battery is being charged.

According to the ninth embodiment, it is possible to estimate the remaining-amount value of battery power highly accurately even while the operating modes are being switched. It is also possible to correctly update the estimated remaining-amount value of battery power even if a video camera is continuously used without switching its operating mode. Further, even if a non-battery type power source is used, an inappropriate remaining-amount value is not displayed.

As described above, according to the ninth embodiment, a decision is made as to whether the type of power source used is a battery or a non-battery type power source, and the operating state of a means for detecting the remaining amount of battery power is controlled in accordance with the result of the decision. Accordingly, it is possible to prevent the detection result provided by the means for detecting the remaining amount of battery power from being influenced by the non-battery type power source, whereby no inappropriate display of the remaining amount is provided. In addition, since the ninth embodiment does not need any mechanical mechanism for determining whether the type of power source used is a battery or a non-battery type power source, it is possible to reduce the size and weight of the device and also to simplify the mechanism. Accordingly, the embodiment is particularly suitable for use with a portable apparatus such as a video camera.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent arrangements and functions.

What is claimed is:

1. A device for detecting a state of charge of a battery, comprising:
   (A) measuring means for measuring a first output of the battery when connected to a first load and a second output of the battery when connected to a second load; and
   (B) detecting means for performing a predetermined computation on the basis of both the first output of the battery and the second output of the battery to detect the state of charge of the battery.

2. A device according to claim 1, wherein said detecting means computes an open circuit voltage of the battery on the basis of both the first output of the battery and the second output of the battery and detects the state of charge of the battery by using a memory which memorized a relation between the open-circuit voltage of the battery and the state of charge of the battery.

3. A device according to claim 1, wherein the detecting means supplies the state of charge of the battery to a display portion which displays a remaining service time of the battery.

4. A device for detecting a state of charge of a battery, comprising:
   (A) measuring means for measuring a first output of the battery when connected to a first load and a second output of the battery when connected to a second load; and
   (B) detecting means for performing a predetermined computation on the basis of both the first output of the battery and the second output of the battery to detect the state of charge of the battery, wherein the detecting means corrects the state of charge of the battery on the basis of a reference data.

5. A device according to claim 4, wherein the detecting means computes an open-circuit voltage of the battery on the basis of both the first output of the battery and the second output of the battery and detects the state of charge of the battery by using a memory which memorized a relation between the open-circuit voltage of the battery and the state of charge of the battery.

6. A device according to claim 4, wherein the detecting means supplies the state of charge of the battery to a display portion which displays a remaining service time of the battery.

7. A device for detecting a state of charge of a battery, comprising:
   (A) measuring means for measuring a first output of the battery when connected to a first load and a second output of the battery when connected to a second load;
   (B) temperature compensation means for compensating the first output of the battery and the second output of the battery on the basis of a temperature condition; and
   (C) detecting means for performing predetermined computation on the basis of both the first output of the battery and the second output of the battery to detect the state of charge of the battery, said first output of the battery and said second output of the battery are temperature-compensated by said temperature compensation means.

8. A device according to claim 7, wherein said detecting means computes an open-circuit voltage of the battery on the basis of both the first output of the battery and the second output of the battery and detects the state of charge of the battery by using a memory which memorized a relation between the open-circuit voltage of the battery and the state of charge of the battery.

9. A device according to claim 7, wherein the detecting means supplies the state of charge of the battery to a display portion which displays a remaining service time of the battery.

10. A device for detecting a state of charge of a battery, comprising:
    (A) measuring means for measuring a first output of the battery when a system connected to the battery is in a first operation mode and a second output of the battery when the system connected to the battery is in a second operation mode, said first operation mode and said second operation mode having a different load;
    (B) detecting means for performing predetermined computation on the basis of both the first output of the battery and the second output of the battery to detect the state of charge of the battery; and
    (C) compensation means for compensating the state of charge of the battery when one of the first and second operation modes continues for a predetermined period on the basis of consumption of the battery in the operation mode.

11. A device according to claim 10, wherein the state of charge of the battery is corrected when one of the first operation mode and the second operation mode continues for a predetermined period, and supplied to a display portion.

12. A device according to claim 11, wherein said detecting means computes an open-circuit voltage of the battery on the basis of both the first output of the battery and the second output of the battery and detects the state of charge of the battery by using a memory which memorized a relation between the open-circuit voltage of the battery and the state of charge of the battery.

13. A device according to claim 10, wherein the detecting means supplies the state of charge of the battery to a display portion which displays a remaining service time of the battery.

14. A method of detecting a state of charge of a battery, comprising:
    (A) measuring a first output of the battery when connected to a first load and a second output of the battery when connected to a second load; and
    (B) performing a predetermined computation on the basis of both the first output of the battery and the second output of the battery to detect the state of charge of the battery.

15. A method in accordance with claim 14 wherein said performing step includes supplying the state of charge of the battery to a display portion which displays the remaining service time of the battery.

16. A method of detecting a state of charge of a battery, comprising:
    (A) measuring a first output of the battery when connected to a first load and a second output of the battery when connected to a second load; and
    (B) performing a predetermined computation on the basis of both the first output of the battery and the second output of the battery to detect the state of charge of the battery, wherein the performing step corrects the state of charge of the battery on the basis of a reference data.

17. A method in accordance with claim 16 wherein said performing step includes supplying the state of charge of the battery to a display portion which displays the remaining service time of the battery.

18. A method of detecting a state of charge of a battery, comprising:
    (A) measuring a first output of the battery when connected to a first load and a second output of the battery when connected to a second load;
    (B) temperature compensating the first output of the battery and the second output of the battery on the basis of a temperature condition; and
    (C) performing predetermined computation on the basis of both the first output of the battery and the second output of the battery to detect the state of charge of the battery, said first output of the battery and said second output of the battery being temperature-compensated by said temperature compensating step.

19. A method in accordance with claim 18 wherein said performing step includes supplying the state of charge of the battery to a display portion which displays the remaining service time of the battery.

20. A method of detecting a state of charge of a battery, comprising:
    (A) measuring a first output of the battery when a system connected to the battery is in a first operation mode and a second output of the battery when the system connected to the battery is in a second operation mode, said first operation mode and said second operation mode having a different load;
    (B) performing predetermined computation on the basis of both the first output of the battery and the second output of the battery to detect the state of charge of the battery; and
    (C) compensating the state of charge of the battery when one of the first and second operation modes continues for a predetermined period on the basis of consumption of the battery in the operation mode.

21. A method in accordance with claim 20 wherein said performing step includes supplying the state of charge of the battery to a display portion which displays the remaining service time of the battery.

* * * * *

UNITED STATES PATENT AND TRADEMARK OFFICE
CERTIFICATE OF CORRECTION

PATENT NO.    : 6,150,823
DATED         : November 21, 2000
INVENTOR(S)   : Koji Takahasi et al.

It is certified that error appears in the above-identified patent and that said Letters Patent is hereby corrected as shown below:

Column 1,
Line 5, delete "625,683" insert -- 625,863 --.

Column 7,
Line 2, delete "voltage E0" and insert -- voltage $E_o$ --.
Line 3, delete "resistance r0" and insert -- resistance $r_o$ --.
Lines 23 and 24, delete Ve" and insert -- $V_E$ --.
Line 30, delete "T1 and T2" and insert -- $T_1$ and $T_2$ --.
Lines 64 and 65, delete "current I1" and insert -- $I_1$ --.
Line 67, delete "V1" and insert -- $V_1$ --.

Column 8,
Line 1, delete "r1" and insert -- $r_1$ --.
Line 2, delete, delete "I1" and insert -- $I_1$ --.
Line 4, delete "I2" and insert -- $I_2$ --.
Line 5, delete "V2" and insert -- $V_2$ --.
Line 6, delete "r2" and insert -- $r_2$ --.
Line 7, delete "voltage E0" and insert -- voltage Eo --.
Line 7, delete "I2" and insert -- $I_2$ --.
Lines 8 and 9, delete "I1, I2, V1 and V2" and insert -- $I_l$, $I_2$, $V_1$ and $V_2$ --.
Line 17, delete "r0=(V1-V2)/(I2-I1)" and insert -- $r_0=(V_1-V_2)/(I_2-I_l)$ --.
Line 18, delete "E0" and insert -- $E_0$ --.
Line 22, delete "T0" and insert -- $T_0$ --.
Line 23, delete "E0" and insert -- $E_0$ --.
Line 26, delete "T0" and insert -- $T_0$ --.
Line 36, delete "E0" and insert -- $E_0$ --.
Line 37, delete "r0" and insert -- $r_o$ --.
Line 38, delete "R1" and insert -- $R_L$ --.
Line 41, delete "C1" and insert -- $C_1$ --.

Column 9,
Line 2, delete "v0" and insert -- $v_0$ --.
Lines 3 and 4, delete "r0" and insert -- $r_0$ --.
Line 10, delete "R1" and insert -- $R_L$ --
Line 11, delete "E0" and insert -- $E_0$ --.
Line 21, delete "v0, vs" and insert -- $v_0$, $v_s$ --.
Line 24, delete "E0" and insert -- $E_0$ --.
Line 25, delete "T0" and insert -- $T_0$ --.
Line 26, delete "E0" and insert -- $E_0$ --.
Line 30, delete "T0" and insert -- $T_0$ --.

UNITED STATES PATENT AND TRADEMARK OFFICE
CERTIFICATE OF CORRECTION

PATENT NO.    : 6,150,823
DATED         : November 21, 2000
INVENTOR(S)   : Koji Takahasi et al.

It is certified that error appears in the above-identified patent and that said Letters Patent is hereby corrected as shown below:

Column 9 cont'd,
Line 49, delete "r1 and r2" and insert -- $r_1$ and $r_2$ --.
Line 51, delete "V1 or V2" and insert -- $V_1$ and $V_2$ --.
Line 52, delete "I1 or I2" and insert -- $I_1$ or $I_2$ --.
Line 54, delete "I1 or I2 " and insert -- $I_1$ or $I_2$ --.
Line 55, delete "V1 or V2" and insert -- $V_1$ and $V_2$ --.

Column 10,
Line 13, delete "I1" and insert -- $I_1$ --.
Line 14, delete "V1" and insert -- $V_1$ --.
Line 20, delete "I2" and insert -- $I_2$ --.
Line 21, delete "V2" and insert -- $V_2$ --.
Line 25, delete "I1, I2, V1 and V2" and insert -- $I_1, I_2, V_1$ and $V_2$ --.
Line 34, delete "R=(Vl-V2)/(I2-I1)" and insert -- $R=(V_1-V_2)/(I_2-I_1)$ --

Column 11,
Line 9, delete "deviation a" and insert -- $\alpha$ --.

Column 12,
Lines 21 and 22, delete "I1 and VI" and insert -- $I_1$ and $V_1$ --.
Line 23, delete "I2 and V2" and insert -- $I_2$ and $V_2$ --.
Line 25, delete " I1, I2, V1 and V2" and insert -- $I_1, I_2, V_1$ and $V_2$ --.
Line 66, delete "E0" and insert -- $E_0$ --.
Line 67, delete "r0" and insert -- $r_0$ --.

Column 13,
Line 3, delete "I1 or I2" and insert -- $I_1$ or $I_2$ --.
Line 7, delete "V1 or V2" and insert -- $V_1$ or $V_2$ --.
Line 14, delete " I1 or I2" and insert -- $I_1$ or $I_2$ --.
Line 14, delete "V1 or V2" and insert -- $V_1$ or $V_2$ --.
Line 18, delete "I1" and insert -- $I_1$ --.
Line 20, delete " V1" and insert -- $V_1$ --.
Line 21, delete "I2" and insert -- $I_2$ --.
Line 23, delete "V2" and insert -- $V_2$ --.
Line 24, delete "E0" and insert -- $E_0$ --.
Line 25, delete "r0" and insert -- $r_0$ --.
Line 34, delete "r0=(Vl-V2)/(I2-I1)" and insert -- $r_0=(V_1-V_2)/(I_2-I_1)$ --
Line 38, delete " E0" and insert -- $E_0$ --.
Line 39, delete " E0" and insert -- $E_0$ --.
Line 46, delete " E0" and insert -- $E_0$ --.

UNITED STATES PATENT AND TRADEMARK OFFICE
CERTIFICATE OF CORRECTION

PATENT NO. : 6,150,823
DATED : November 21, 2000
INVENTOR(S) : Koji Takahasi et al.

It is certified that error appears in the above-identified patent and that said Letters Patent is hereby corrected as shown below:

Column 14,
Line 3, delete "I1" and insert -- $I_1$ --.
Line 4, delete "V1" and insert -- $V_1$ --.
Line 8, delete "V2" and insert -- $V_2$ --.
Line 8, delete "V1 or V2" and insert -- $V_1$ or $V_2$ --.
Line 9, delete "E0" and insert -- $E_0$ --.
Line 10, delete "I1, I2, V1 and V2" and insert -- $I_1$, $I_2$, $V_1$ and $V_2$ --.
Line 12, delete " E0" and insert -- $E_0$ --.
Line 16, delete "T0" and insert -- $T_0$ --.
Line 17, delete " E0" and insert -- $E_0$ --.
Line 19, delete " T0" and insert -- $T_0$ --.
Line 31, delete " V1 or V2" and insert -- $V_1$ or $V_2$ --.
Line 39, delete "Vb" and insert -- $V_B$ --.
Line 47, delete " Vb" and insert -- $V_B$ --.
Line 59, delete " V1 or V2" and insert -- $V_1$ or $V_2$ --.

Column 15,
Line 5, delete "V1 or V2" and insert -- $V_1$ or $V_2$ --.
Line 40, delete "of the" and insert -- to which --.
Line 44, delete "I1" and insert -- $I_1$ --.
Line 45, delete "r1, v1" and insert -- $r_1$, $v_1$ --.
Line 46, delete "I2" and insert -- $I_2$ --.
Line 47, delete "r2, and V2" and insert -- $r_2$, and $V_2$ --.
Line 63, delete " VI or V2" and insert -- $V_1$ or $V_2$ --.
Line 64, delete " VI or V2" and insert -- $V_1$ or $V_2$ --.
Line 64, delete "I1 and I2" and insert -- $I_1$ and $I_2$ --.

Column 16,
Line 1, delete " V1 or V2" and insert -- $V_1$ or $V_2$ --.
Line 3, delete "V1, V2, I1 and I2" and insert -- $V_1$, $V_2$, $I_1$ and $I_2$ --.
Line 35, delete "V1" and insert -- $V_1$ --.
Line 53, delete "V" and insert -- v --.

Column 17,
Line 12, delete "V1" and insert -- $V_1$ --.
Line 14, delete "V2" and insert -- $V_2$ --.
Line 16, delete "V1" and insert -- $V_1$ --.
Line 17, delete "V1" and insert -- $V_1$ --.
Line 20, delete "V2" and insert -- $V_2$ --.
Line 22, delete "v2" and insert -- $v_2$ --.

UNITED STATES PATENT AND TRADEMARK OFFICE
CERTIFICATE OF CORRECTION

PATENT NO. : 6,150,823
DATED : November 21, 2000
INVENTOR(S) : Koji Takahasi et al.

It is certified that error appears in the above-identified patent and that said Letters Patent is hereby corrected as shown below:

Column 18,
Line 14, delete "I1" and insert -- $I_1$ --.
Line 15, delete "r1, V1" and insert -- $r_1$, $V_1$ --.
Line 16, delete "I2" and insert -- $I_2$ --.
Line 17, delete "r2 and V2" and insert -- $r_2$ and $V_2$ --.
Line 20, delete "V1 and V2" and insert -- $V_1$ and $V_2$ --.
Line 23, delete "I1 and I2" and insert -- $I_1$ and $I_2$ --.
Line 24, delete "V1 and V2" and insert -- $V_1$ and $V_2$ --.
Line 26, delete "V1, V2, I1 and I2" and insert -- $V_1$, $V_2$, $I_1$ and $I_2$ --.
Line 30, delete "(=V1-V2)" and insert -- =($V_1$ · $V_2$) --.

Column 19,
Line 6, delete "V1" and insert -- $V_1$ --.
Line 7, delete "I2" and insert -- $I_2$ --.
Line 11, delete "V2" and insert -- $V_2$ --.
Line 14, delete "I1" and insert -- $I_1$ --.
Line 15, delete "VI, V2, I1 and I2" and insert -- $V_1$, $V_2$, $I_1$ and $I_2$ --.
Line 16, delete "v1" and insert -- $v_1$ --.
Line 22, delete "V1" and insert -- $V_1$ --.
Line 24, delete "I2" and insert -- $I_2$ --.
Line 26, delete "I1" and insert -- $I_1$ --.
Line 27, delete "V2" and insert -- $V_2$ --.
Line 29, delete "I2" and insert -- $I_2$ --.
Line 30, delete "v2" and insert -- $v_2$ --.
Line 31, delete "V1, V2, I1 and I2" and insert -- $V_1$, $V_2$, $I_1$ and $I_2$ --.
Line 34, delete "v1" and insert -- $v_1$ --.
Line 34, delete "v2" and insert -- $v_2$ --.
Line 66, delete "V1" and insert -- $V_1$ --.

Column 20,
Line 49, delete "$T_a=aiv^2+a2v+a3$, $T_a=a4v+a5$ and $T_a=a6v^2+a7v+a8$" and insert
-- $T_A=a1v^2+a2v+a3$, $T_A=a4v+a5$ and $T_A=a6v^2+a7v+a8$ --.
Line 53, delete "$T_b=b1v^2+b2v=b3$, $Tb=b4v+b5$ and $T_b=b6V^2+b7v+b8$" and insert
-- $T_B=b1v^2+b2v=b3$, $T_B=b4v+b5$ and $T_B=b6v^2+b7v+b8$ --.

UNITED STATES PATENT AND TRADEMARK OFFICE
CERTIFICATE OF CORRECTION

PATENT NO. : 6,150,823
DATED : November 21, 2000
INVENTOR(S) : Koji Takahasi et al.

It is certified that error appears in the above-identified patent and that said Letters Patent is hereby corrected as shown below:

Column 21,
Line 17, delete "V2" and insert -- $V_2$ --.
Line 19, delete "$T_a$" and insert -- $T_A$ --.
Line 29, delete "V2" and insert -- $V_2$ --.
Line 31, delete " $T_b$" and insert -- $T_B$ --.
Line 32, delete "$V_b1$ and $V_b2$" and insert -- $V_B1$ and $V_B2$ --.
Line 44, delete "$T_a$, $T_b$, and $T_c$" and insert -- $T_A$, $T_B$, and $T_C$ --.

Column 22,
Line 63, delete "r1 and r2" and insert -- $r_1$ and $r_2$ --.
Line 66, delete "r1 and r2" and insert -- $r_1$ and $r_2$ --.
Line 67, delete "I1" and insert -- $I_1$ --.

Column 23,
Line 1, delete "r1, V1" and insert -- $r_1$, $V_1$ --.
Line 2, delete "r1, I2" and insert -- $r_1$, $I_2$ --.
Line 4, delete "r2, and V2" and insert -- $r_2$, and $V_2$ --.
Line 5, delete "r2" and insert -- $r_2$ --.
Line 6, delete "R=(V2-V1)/I1-I2)" and insert -- $R=(V_2.V_1)/I_1-I_2)$ --.
Line 15, delete "v=V+I(V2-V1)/(I1-I2)" and insert -- $v=V+I(V_2-V_1)/(I_1-I_2)$ --.
Line 23, delete "I1, I2, V1, V2" and insert -- $I_1$, $I_2$, $V_1$, $V_2$ --.
Line 55, delete "V1" and insert -- $V_1$ --.
Line 57, delete "I1" and insert -- $I_1$ --.
Line 60, delete "V2" and insert -- $V_2$ --.
Line 61, delete "I2" and insert -- $I_2$ --.

Column 24,
Line 33, delete "I1 and V1" and insert -- $I_1$ and $V_1$ --.
Line 34, delete "I2 and V2" and insert -- $I_2$ and $V_2$ --.
Line 43, delete "r1 and r2" and insert -- $r_1$ and $r_2$ --.
Line 46, delete "r1" and insert -- $r_1$ --.
Line 47, delete "r1 and r2" and insert -- $r_1$ and $r_2$ --.
Line 48, delete "I1" and insert -- $I_1$ --.
Line 49, delete "r1, V1" and insert -- $r_1$, $V_1$ --.
Line 50, delete "r1, I2" and insert -- $r_1$, $I_2$ --.
Line 52, delete "r2, V2" and insert -- $r_2$, $V_2$ --.
Line 53, delete "r2" and insert -- $r_2$ --.
Line 67, delete "I1, I2, V1, V2" and insert -- $I_1$, $I_2$, $V_1$, $V_2$ --.

UNITED STATES PATENT AND TRADEMARK OFFICE
CERTIFICATE OF CORRECTION

PATENT NO. : 6,150,823
DATED : November 21, 2000
INVENTOR(S) : Koji Takahasi et al.

It is certified that error appears in the above-identified patent and that said Letters Patent is hereby corrected as shown below:

Column 26,
Line 36, delete "v" and insert -- $v_1$ --.
Line 38, delete "I1" and insert -- $I_1$ --.
Line 41, delete "V2" and insert -- $V_2$ --.

Column 27,
Line 18, delete "I2 and V2" and insert -- $I_2$ and $V_2$ --.
Line 19, delete "I2 and V2" and insert -- $I_2$ and $V_2$ --.

Signed and Sealed this

Thirteenth Day of August, 2002

*Attest:*

JAMES E. ROGAN
*Attesting Officer*     *Director of the United States Patent and Trademark Office*